United States Patent
Teraguchi et al.

(10) Patent No.: US 8,970,520 B2
(45) Date of Patent: Mar. 3, 2015

(54) DISPLAY DEVICE AND ELECTRONIC UNIT

(75) Inventors: Shinichi Teraguchi, Kanagawa (JP); Manabu Kodate, Kanagawa (JP); Seonghee Noh, Kanagawa (JP); Keisuke Omoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 458 days.

(21) Appl. No.: 13/406,018

(22) Filed: Feb. 27, 2012

(65) Prior Publication Data
US 2012/0249454 A1    Oct. 4, 2012

(30) Foreign Application Priority Data

Mar. 31, 2011   (JP) .................. 2011-078491

(51) Int. Cl.
*G06F 3/041*   (2006.01)
*H01L 27/32*   (2006.01)
*G06F 3/044*   (2006.01)

(52) U.S. Cl.
CPC ............ *G06F 3/0412* (2013.01); *H01L 27/323* (2013.01); *G06F 3/044* (2013.01); *H01L 27/32* (2013.01); *H01L 27/3244* (2013.01)
USPC ........................................................ 345/173

(58) Field of Classification Search
None
See application file for complete search history.

(56) References Cited

U.S. PATENT DOCUMENTS

2008/0062148 A1 *   3/2008   Hotelling et al. ............. 345/174
2008/0211395 A1 *   9/2008   Koshihara et al. ............ 313/504

FOREIGN PATENT DOCUMENTS

JP   2009-244958   10/2009

* cited by examiner

*Primary Examiner* — Nicholas Lee
(74) *Attorney, Agent, or Firm* — Rader, Fishman & Grauer PLLC

(57) ABSTRACT

A display device includes: a first substrate having a light extraction plane; a plurality of first electrodes; an organic electroluminescence layer; a second electrode; a second substrate; a sensing electrode allowing an object to be detected; and a driving electrode forming a capacitance with the sensing electrode and allowing the object to be detected. The first electrodes, the organic electroluminescence layer, the second electrode, and the second substrate are provided in this order on the first substrate. The sensing electrode and the driving electrode are provided, in this order from a first substrate side, between the first substrate and the second substrate.

20 Claims, 23 Drawing Sheets

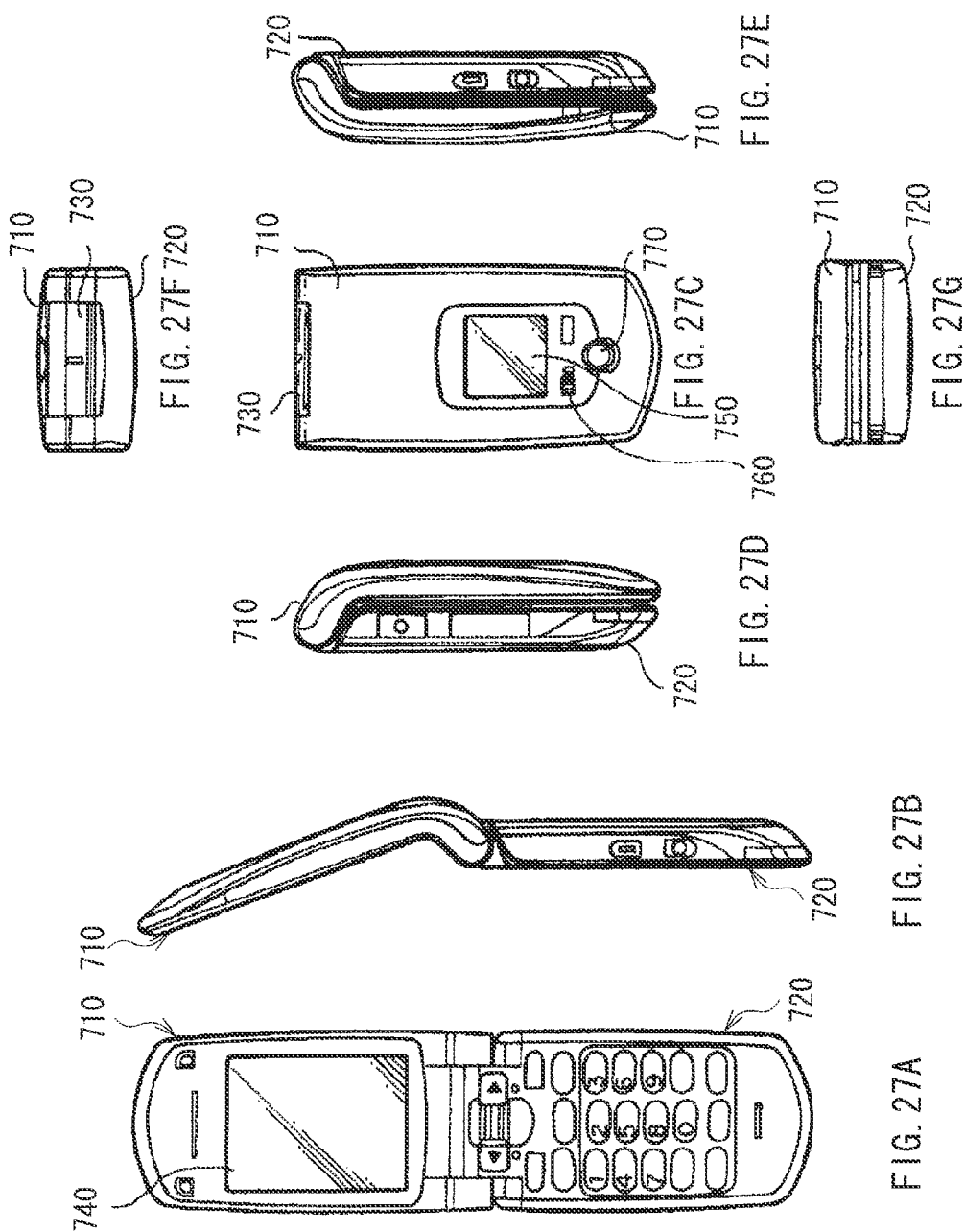

DISPLAY DEVICE AND ELECTRONIC UNIT

BACKGROUND

The present disclosure relates to a display device which displays images by using an organic electroluminescence element, and particularly to a display device having a touch sensor function.

In recent years, there are more and more display devices and electronic units having a touch sensor function which allows users to input information (detect objects) with their fingers, styluses, or the like. Concern over such display devices and electronic units is that the entire thickness of the device is increased because a touch panel is often incorporated in the device as a module by being mounted directly on a display screen, for example.

To address this, the following technique is being proposed in liquid crystal displays (LCDs) having a touch sensor function. In a liquid crystal display, an image is displayed in such a manner that a voltage is applied to a liquid crystal layer sandwiched between a pixel electrode and a common electrode. By using this common electrode for image display also as a driving electrode for sensor, the thickness of the entire device is reduced (for example, see Japanese Unexamined Patent Application Publication No. 2009-244958). In this case, a common signal to be applied to the common electrode to drive display is used as a driving signal for sensor. In order to detect an object, a touch panel utilizes both of a driving electrode and a sensing electrode which form a capacitance. However, allowing an existing electrode (such as common electrode) in a display device to serve also as the driving electrode makes it possible to additionally provide only the sensing electrode.

SUMMARY

A display device which uses an organic electroluminescence (hereinafter referred to as EL) element for a pixel has a basic configuration significantly different from that of the above liquid crystal liquid display, and has two different light extraction methods of a bottom emission method and a top emission method. In such an organic EL display device, realization of a touch sensor function without significantly increasing the thickness is being desired.

It is desirable to provide a display device and an electronic unit in which a touch sensor function can be added without increasing the thickness of the entire device when an organic EL element is used for a display pixel.

A first display device, which may be a bottom emission type, according to an embodiment of the present disclosure includes: a first substrate having a light extraction plane; a plurality of first electrodes; an organic electroluminescence layer; a second electrode; a second substrate, wherein the first electrodes, the organic electroluminescence layer, the second electrode, and the second substrate are provided in this order on the first substrate; a sensing electrode allowing an object to be detected; and a driving electrode forming a capacitance with the sensing electrode and allowing the object to be detected, the sensing electrode and the driving electrode being provided, in this order from a first substrate side, between the first substrate and the second substrate.

A second display device, which may be a top emission type, according to an embodiment of the present disclosure includes: a first substrate; a plurality of first electrodes; an organic electroluminescence layer; a second electrode; a second substrate having a light extraction plane, wherein the first electrodes, the organic electroluminescence layer, the second electrode, and the second substrate are provided in this order on the first substrate; a driving electrode provided between the first substrate and the second substrate, the driving electrode allowing an object to be detected; and a sensing electrode provided on a second substrate side of the driving electrode, the sensing electrode forming a capacitance with the driving electrode and allowing the object to be detected.

A first electronic unit according to an embodiment of the present disclosure includes a display device including: a first substrate having a light extraction plane; a plurality of first electrodes; an organic electroluminescence layer; a second electrode; a second substrate, wherein the first electrodes, the organic electroluminescence layer, the second electrode, and the second substrate are provided in this order on the first substrate; a sensing electrode allowing an object to be detected; and a driving electrode forming a capacitance with the sensing electrode and allowing the object to be detected, the sensing electrode and the driving electrode being provided, in this order from a first substrate side, between the first substrate and the second substrate.

A second electronic unit according to an embodiment of the present disclosure includes a display device including: a first substrate; a plurality of first electrodes; an organic electroluminescence layer; a second electrode; a second substrate having a light extraction plane, wherein the first electrodes, the organic electroluminescence layer, the second electrode, and the second substrate are provided in this order on the first substrate; a driving electrode provided between the first substrate and the second substrate, the driving electrode allowing an object to be detected; and a sensing electrode provided on a second substrate side of the driving electrode, the sensing electrode forming a capacitance with the driving electrode and allowing the object to be detected.

The first display device and the first electronic unit according to the embodiments of the present disclosure include the first substrate having the light extraction plane, the plurality of first electrodes, the organic electroluminescence layer, the second electrode, and the second substrate. The first electrodes, the organic electroluminescence layer, the second electrode, and the second substrate are provided in this order on the first substrate. Further, the sensing electrode and the driving electrode are included. The sensing electrode allows an object to be detected, and the driving electrode forms the capacitance with the sensing electrode and allows the object to be detected. The sensing electrode and the driving electrode are provided, in this order from a first substrate side, between the first substrate and the second substrate. With this configuration, light emitted from the organic electroluminescence layer is extracted from the first substrate side (an image is displayed on the first substrate side), while the object in contact with or in proximity to the first substrate serving as a display screen is detected (object detection is performed on the first substrate side).

The second display device and the second electronic unit according to the embodiments of the present disclosure include the first substrate, the plurality of first electrodes, the organic electroluminescence layer, the second electrode, and the second substrate having the light extraction plane. The first electrodes, the organic electroluminescence layer, the second electrode, and the second substrate are provided in this order on the first substrate. Further, the driving electrode and the sensing electrode are included. The driving electrode is provided between the first substrate and the second substrate and allows the object to be detected. The sensing electrode is provided on the second substrate side of the driving electrode, and forms the capacitance with the driving electrode and allows the object to be detected. With this configuration, light emitted from the organic electroluminescence layer is extracted from the second substrate side (an image is displayed on the second substrate side), while the object in contact with or in proximity to the second substrate serving as a display screen is detected (object detection is performed on the second substrate side).

In the first display device and the first electronic unit according to the embodiments of the present disclosure, the first substrate having the light extraction plane, the plurality of first electrodes, the organic electroluminescence layer, the second electrode, and the second substrate are included. The first electrodes, the organic electroluminescence layer, the second electrode, and the second substrate are provided in this order on the first substrate. Further, the sensing electrode and the driving electrode are included. The sensing electrode allows an object to be detected, and the driving electrode forms the capacitance with the sensing electrode and allows the object to be detected. The sensing electrode and the driving electrode are provided, in this order from a first substrate side, between the first substrate and the second substrate. This makes it possible to perform object detection without externally mounting a touch panel on the first substrate serving as the light extraction plane, thus making it possible to add a touch sensor function without increasing the thickness of the entire device.

In the second display device and the second electronic unit according to the embodiments of the present disclosure, the first substrate, the plurality of first electrodes, the organic electroluminescence layer, the second electrode, and the second substrate having the light extraction plane are included. The first electrodes, the organic electroluminescence layer, the second electrode, and the second substrate are provided in this order on the first substrate. Further, the driving electrode and the sensing electrode are included. The driving electrode is provided between the first substrate and the second substrate and allows the object to be detected. The sensing electrode is provided on the second substrate side of the driving electrode, and forms the capacitance with the driving electrode and allows the object to be detected. This makes it possible to perform object detection without externally mounting a touch panel on the second substrate serving as the light extraction plane, thus making it possible to add a touch sensor function without increasing the thickness of the entire device.

It is to be understood that both the foregoing general description and the following detailed description are exemplary and are intended to provide further explanations of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 27A and 27B are a front view and a side view of a fifth application example in an open state, respectively. FIGS. 27C, 27D, 27E, 27F, and 27G are a front view, a left-side view, a right-side view, a top view, and a back view of the fifth application example in a closed state, respectively.

DETAILED DESCRIPTION

Hereinafter, embodiments of the present disclosure will be described in detail with reference to the drawings. The descriptions will be made in the following sequence:
1. First Embodiment (an example in which a bottom emission scheme is employed and a driving electrode for sensor is provided in the same layer as a layer where a pixel electrode (anode) is provided)
2. First Modification (an example in which a metal for leakage prevention is used)
3. Second Modification (a scanning line, which is a gate line for pixel transistor, is used as a driving electrode for sensor)
4. Third Modification (an example in which a power source line is used as a driving electrode for sensor)
5. Fourth Modification (an example in which a signal line is used as a driving electrode for sensor)
6. Second Embodiment (an example in which a top emission scheme is employed and a driving electrode for sensor is provided in the same layer as a layer where an upper electrode (cathode) is provided)
7. Fifth Modification (an example in which a black matrix is used as a driving electrode for sensor)
8. Sixth Modification (an example in which a driving electrode for sensor is provided between protective layers)
9. Application Examples (an application example in which a display device equipped with a touch sensor is applied to an electronic unit)

First Embodiment

Example Configuration of Organic EL Display Device 1

Figure 1:
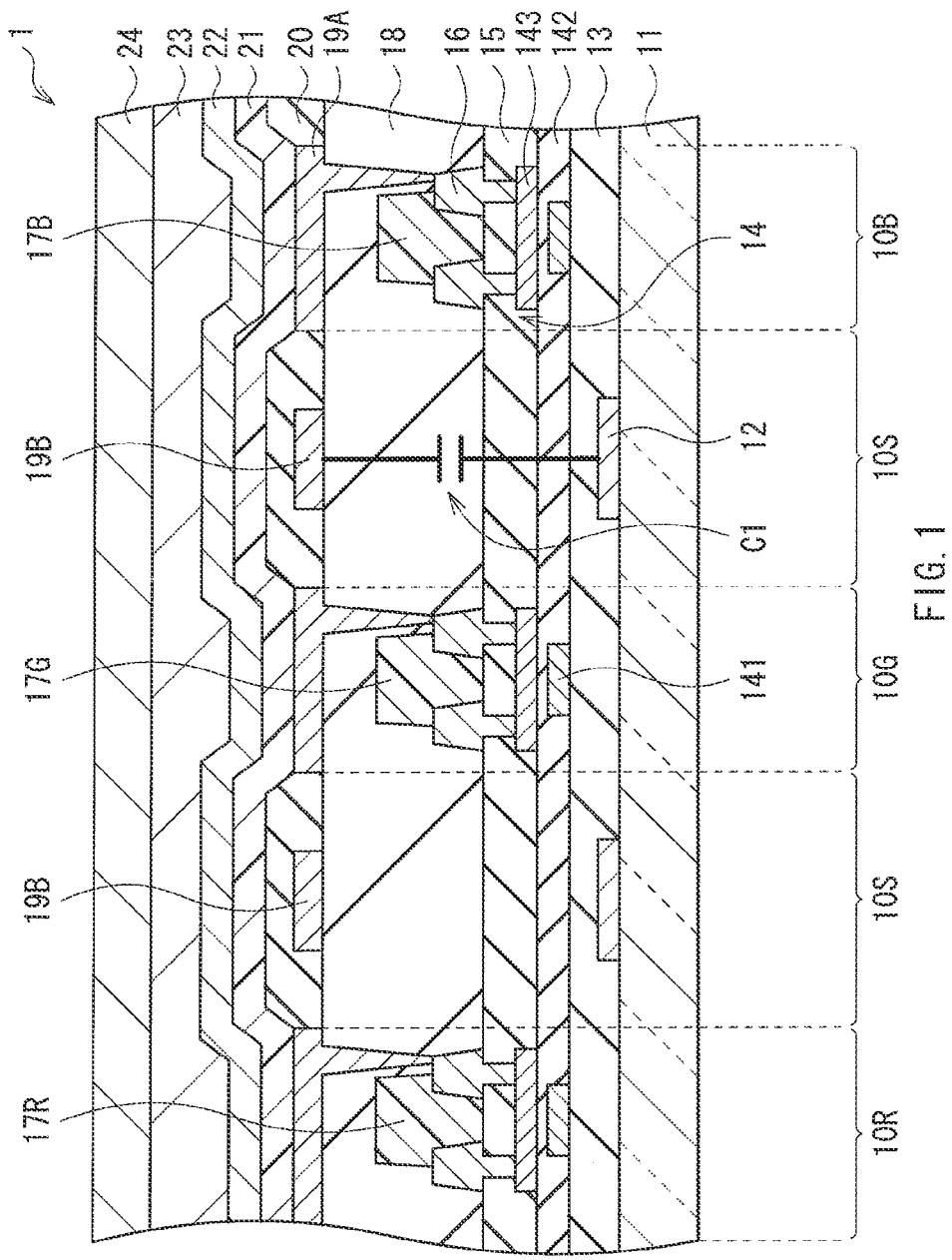
FIG. 1 is a cross-sectional view illustrating a schematic configuration of an organic EL display device according to a first embodiment of the present disclosure.

FIG. 1 illustrates a cross-sectional configuration of an organic EL display device 1 according to a first embodiment of the present disclosure. The organic EL display device 1 includes a plurality of organic EL elements of a bottom emission type as display pixels, and has a touch sensor function of a capacitance type. Further, the organic EL display device 1 includes, between a transparent substrate 11 and a sealing substrate 24, pixel sections 10R, 10G, 10B and a sensor section 10S. The transparent substrate 11 and the sealing substrate 24 in this embodiment are examples of the "first substrate" and "second substrate", respectively, in the first display device according to one embodiment of the present disclosure.

The pixel sections 10R, 10G, and 10B are sub-pixels containing red (R), green (G), and blue (B) organic EL elements, respectively, and form one pixel. The sensor section 10S is provided in selective regions among the pixel sections 10R, 10G, and 10B. That is, in the organic EL display device 1, the pixel sections 10R, 10G, 10B, and the sensor sections 10S are disposed in the display region in a mixed fashion. Hereinafter, detailed description will be made of the cross-sectional configuration of each section, peripheral circuits, and pixel circuit, for example.

(Example of Cross-Sectional Configuration of Pixel Sections)

In the pixel sections 10R, 10G, and 10B, a transistor section 14 is provided on the transparent substrate 11 with an insulating film 13 interposed therebetween. The transistor section 14 corresponds to pixel transistors Tr1 and Tr2 described later, and has, for example, a gate electrode 141 on the insulating film 13, and a semiconductor layer 143 on the gate electrode 141 with a gate insulating film 142 interposed therebetween. The semiconductor layer 143 is made of any one of amorphous silicon, polysilicon, microcrystalline silicon, and oxide semiconductor, for example, and forms a channel. A source-drain electrode layer 16 is arranged on the semiconductor layer 143 of the transistor section 14, and an interlayer insulating film 15 is provided to cover the source-drain electrode layer 16.

A contact hole is formed in the interlayer insulating film 15 to electrically communicate with the semiconductor layer 143 (more specifically, the source-drain electrode), and a source-drain electrode layer 16 is provided on the interlayer insulating film 15 to fill the contact hole. Color filter layers of the colors corresponding to the pixel sections 10R, 10G, and 10B are formed on predetermined regions (regions corresponding to pixel electrodes 19A described later) of the source-drain electrode layers 16. Specifically, a red filter layer 17R, a green filter layer 17G, and a blue filter layer 17B are provided so as to correspond to the pixel sections 10R, 10G, and 10B, respectively. The red filter layer 17R, the green filter layer 17G, and the blue filter layer 17B are so-called on-chip color filters, and are formed of, for example, photosensitive resin material containing pigment. Although the color filter layers may be provided directly on the source-drain electrode layers 16 (in contact with the source-drain electrode layers 16) as shown in FIG. 1, a certain layer may be interposed between the source-drain electrode layers 16 and the color filter layers. Alternatively, the color filter layers may be formed below the source-drain electrode layers 16. In this case, the color filter layers may be or may not be in contact with the source-drain electrode layers 16. In other words, the location of the color filter layers is not particularly limited as long as they are each located between the light emitting region and the light extraction plane. Further, the color filter layers are not limited to the on-chip color filters and may be formed adjacent to the sealing substrate 24.

A planarization film 18 is provided so as to cover the source-drain electrode layers 16, the red filter layer 17R, the green filter layer 17G, and the blue filter layer 17B. Contact holes are formed in regions corresponding to the source-drain electrode layers 16. The planarization film 18 is formed of, for example, an inorganic or organic insulating film. A plurality of pixel electrodes 19A are arranged on the planarization film 18 to fill the contact holes.

The pixel electrodes 19A each function as an anode for injecting holes into an organic layer 21 (white light emitting layer) described later. The regions corresponding to the plurality of pixel electrodes 19A are the pixel sections 10R, 10G, and 10B. The pixel electrodes 19A are each formed of a transparent conducting film made of, for example, an oxide of indium and tin (ITO) or an oxide of indium and zinc (IZO), and transmit, to a lower direction (toward the transparent substrate 11), the light emitted from the organic layer 21. Each pixel electrode 19A may be formed of a single film of a co-deposited film of magnesium and silver (Mg—Ag) or a lamination of the co-deposited film. On the pixel electrodes 19A, a pixel separation film (window film) 20 having openings corresponding to the pixel electrodes 19A is provided.

The pixel separation film 20 is formed of, for example, an insulating film such as photosensitive resin and polyimide and serves to define a light emitting region of a pixel. The organic layer 21 is formed on the pixel separation film 20 over the entire substrate, for example.

The organic layer 21 includes, common to the pixel sections 10R, 10G, and 10B, a white light emitting layer which emits white light by recombination of holes and electrons, for example. Specifically, the organic layer 21 has, as the white light emitting layer, a tandem construction (lamination structure) of a red light emitting layer, a green light emitting layer, and a blue light emitting layer, for example. In such a manner that the red, green, and blue lights emitted from the respective emitting layers mix with one another, white light emission is achieved. Alternatively, the white light emitting layer may be formed of a tandem construction of a blue (B) light emitting layer and a yellow (Y) light emitting layer. Further, a lamination of a hole injection layer, a hole transport layer, and an electron transport layer (not shown in the drawings) may be employed other than the white light emitting layer, for example. Moreover, instead of the white light emitting layer, light emitting layers of various colors (a red light emitting layer, a green light emitting layer, and a blue light emitting layer) may be painted differently for the pixel sections 10R, 10G, and 10B. An upper electrode 22 is deposited on the entire surface of such organic layer 21.

The upper electrode 22 is common to the pixel sections 10R, 10G, and 10B, and functions as a cathode for injecting electrons into the organic layer 21, for example. The upper electrode 22 is formed of reflective metal material, which can be a single metal element such as silver (Ag), aluminum (Al), molybdenum (Mo) and chromium (Cr), or an alloy of the metal elements, for example. The upper electrode 22 may be a single layer film using the above metal material or a lamination film of at least two of the metal elements. An electron injection layer may be provided between the upper electrode 22 and the organic layer 21.

A protective layer 23 is formed of, for example, a silicon nitride film or a silicon oxide film, and serves to seal and protect the pixel sections 10R, 10G, and 10B. A sealing substrate 24 is attached to the protective layer 23 with an adhesive layer (not shown in the drawings) of, for example, UV cured resin interposed therebetween.

(Example of Cross-Sectional Configuration of Sensor Section)

Since the sensor sections 10S are provided in the regions among the pixel sections 10R, 10G, and 10B, the sensor sections 10S share most of the layers with the pixel sections 10R, 10G, and 10B, and have the sensing electrodes 12 and the driving electrodes 19B for sensor in the same layers among the respective layers between the transparent substrate 11 and the sealing substrate 24. The sensing electrode 12 and the driving electrode 19B for sensor are laminated so that a capacitance (capacitor C1) is formed. More specifically, the sensing electrode 12 and the driving electrode 19B for sensor form a capacitance through application of voltage thereto.

In this embodiment, the sensing electrode 12 is arranged on the selective regions on the transparent substrate 11 and is covered with the insulating film 13. However, in the bottom emission scheme, the sensing electrode 12 is provided at any position between the driving electrode 19B for sensor and a detected object (for example, finger) so that a capacitance is formed between the sensing electrode 12 and the driving electrode 19B for sensor and between the sensing electrode 12 and the detected object. The sensing electrode 12 is formed of, for example, molybdenum (Mo).

Further, the driving electrodes 19B for sensor are arranged in the same layer (on the planarization film 18 in this embodiment) as the layer of the pixel electrodes 19A in the pixel sections 10R, 10G, and 10B, and are formed of the same conductive film material as that of the pixel electrodes 19A, for example. In other words, a layer of the conductive film material is patterned on the planarization film 18, so that the layer functions as the pixel electrode 19A in each of the pixel sections 10R, 10G, and 10B and as the driving electrode 19B for sensor in each of the sensor sections 10S.

(Example of Electrode Layout)

Figure 2:
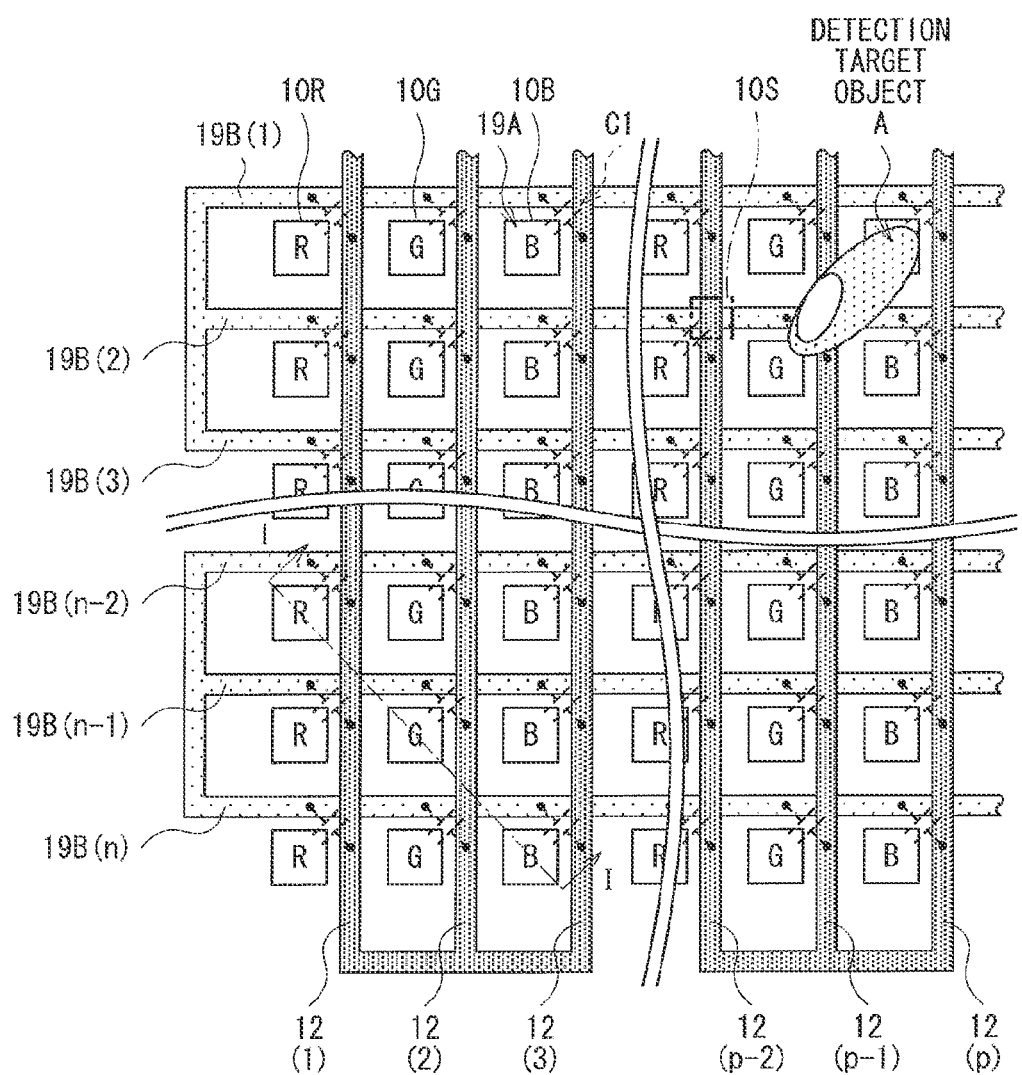
FIG. 2 is a plan schematic view illustrating an example layout of the pixel electrodes, the driving electrodes for sensor, and the sensing electrodes shown in FIG. 1.

FIG. 2 schematically illustrates an example layout (example arrangement configuration along the substrate plane) of the sensing electrodes 12, pixel electrodes 19A, and the driving electrodes 19B for sensor, viewed from the sensing electrodes 12. Note that the cross-sectional view of FIG. 2 taken along the line I-I in FIG. 2 corresponds to FIG. 1. As shown in the drawing, a plurality of pixel electrodes 19A are two-dimensionally arranged in a matrix pattern to correspond to the arrangement of the pixel sections 10R, 10G and 10B. The driving electrodes 19B for sensor are patterned in a stripe pattern so as to extend in one direction among the pixel electrodes 19A. The pixel electrodes 19A and the driving electrodes 19B for sensor may be formed in the same process by forming the conductive film material on the entire surface of the planarization film 18 and then forming the layout pattern at one time using a photolithography technique, for example.

The number of driving electrodes 19B for sensor (19B(1) to 19B(n)) formed is at least two (n-pieces in this embodiment), and the driving electrodes 19B(1) to 19B(n) for sensor are provided side-by-side, for example. Also, "m" (m is an integer from 2 to n, both inclusive) number of driving electrodes 19B for sensor of the driving electrodes 19B(1) to 19B(n) for sensor may be electrically connected together, or the n-number of driving electrodes 19B for sensor may be all electrically separated. When the m-number of driving electrodes 19B for sensor are electrically connected, they are arranged in the shape of teeth of a comb in such a manner that they are connected together at their respective ends, and make one set (unit driving line) to which a driving signal can be applied. Herein, for example, an electrode in the shape of comb teeth formed by connecting three driving electrodes 19B for sensor together makes a unit driving line, and a plurality of unit driving lines are arranged in parallel. Note that when the m-number of driving electrodes 19B for sensor are simultaneously driven, they do not necessarily have to be connected together at their respective ends as described above. For example, if the n-number of driving electrodes 19B for sensor are all provided separately from one another (electrically independent of one another), it is possible to simultaneously apply a driving signal to all of the m-number of driving electrodes 19B for sensor.

Figure 3:
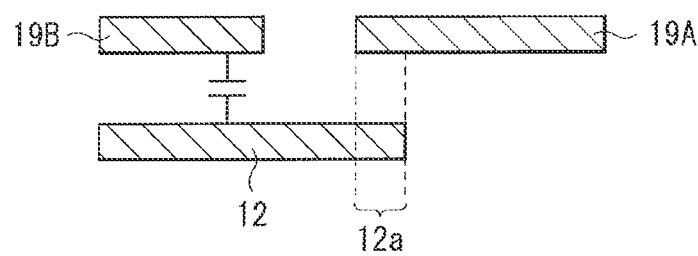
FIG. 3 is a cross-sectional schematic view illustrating another example layout of the sensing electrodes and the pixel electrodes.

On the other hand, the sensing electrodes 12 are patterned in a stripe pattern in the regions among the plurality of pixel electrodes 19A (without being overlapped with the pixel electrodes 19A) so as to extend in a direction intersecting (in this embodiment, orthogonal to) the direction in which the plurality of driving electrodes 19B for sensor extend. Further, the number of sensing electrodes 12 formed is at least two (p-number in this embodiment), and the sensing electrodes 12(1) to 12(p) are provided side-by-side, for example. The sensing electrodes 12 and the pixel electrodes 19A do not necessarily have to be overlapped with one another. Specifically, a part 12a of the sensing electrode 12 may be overlapped with the pixel electrode 19A, as shown in FIG. 3, as long as the sensing electrode 12 is arranged so that the sensing electrode 12 forms a capacitance with the driving electrode 19B for sensor.

Also, "q" (q is an integer from 2 to p, both inclusive) number of sensing electrodes 12 of the p-number of sensing electrodes may be electrically connected together, or the p-number of sensing electrodes may be all electrically separated. When the q-number of sensing electrodes 12 are electrically connected, they are arranged in the shape of teeth of a comb in such a manner that they are connected together at their respective ends, and make a unit detection line capable of acquiring a detection signal. When the p-number of sensing electrodes are all electrically separated, a detection signal is acquired for each of the sensing electrodes 12. Herein, for example, an electrode in the shape of comb teeth formed by connecting three sensing electrodes 12 makes a unit detection line, and a plurality of unit detection lines are arranged in parallel. Note that when the q-number of sensing electrodes 12 are simultaneously driven, they do not necessarily have to be connected together at their respective ends as described above. For example, if the p-number of sensing electrodes 12 are all provided separately from one another (electrically independent of one another), it is possible to simultaneously read a detection signal from each of the q-number of sensing electrodes 12.

In the aforementioned layout of the sensing electrodes 12 and the driving electrodes 19B for sensor, dielectric layers (planarization film 18, interlayer insulating film 15, gate insulating film 142, and insulating film 13 in this embodiment) which are formed continuously from the pixel sections 10R, 10G, and 10B are (for example, vertically) sandwiched between the sensing electrodes 12 and the driving electrodes 19B for sensor at the intersections of the sensing electrodes 12 with the driving electrodes 19B for sensor. In other words, a capacitor C1 is formed at the intersections of the sensing electrodes 12 with the driving electrodes 19B for sensor, (the intersections each function as the sensor section 10S).

Further, by providing at least two sensing electrodes 12 and at least two driving electrodes 19B for sensor so that the sensing electrodes 12 intersect with the driving electrodes 19B for sensor, the intersections or the sensor sections 10S are two-dimensionally formed in a matrix pattern, thereby making it possible to detect the location of an object as two-dimensional coordinates. In addition, it is possible to detect the presence or absence of touch by a plurality of persons or fingers (so-called multi-touch).

A driving signal (Vs) of an alternating and rectangular waveform, for example, is applied to the driving electrodes 19B for sensor from a driving electrode driver 19D described later. Detailed description of this will be made later. A detection signal (Vdet) based on the capacitance is obtained from the sensing electrodes 12, and the obtained detection signal is sent to a detection circuit 8 described later.

(Example Configuration of Peripheral Circuits)

Figure 4:
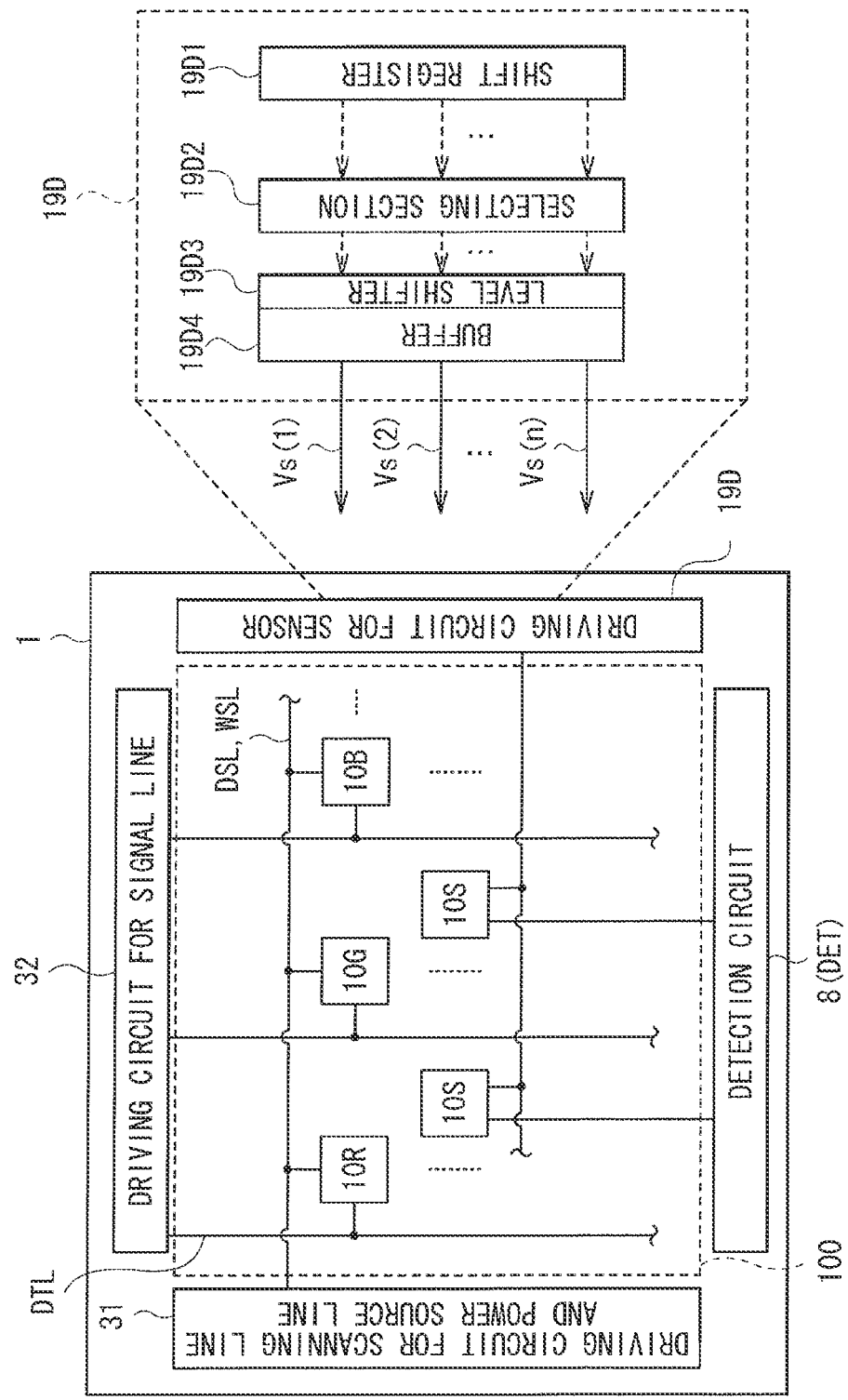
FIG. 4 is a block diagram illustrating an example of the effective display region and the peripheral circuits thereof in the organic EL display device shown in FIG. 1.

FIG. 4 illustrates an example configuration of peripheral circuits (drivers of various types) in the organic EL display device 1. In the organic EL display device 1, the plurality of pixel sections 10R, 10G, and 10B are two-dimensionally arranged in a matrix pattern in an effective display region 100, and the sensor section 10S is provided in the selective regions among the pixel sections 10R, 10G, and 10B, for example. In the regions around the effective display region 100, a driving circuit 31 for a scanning line and a power source line and a driving circuit 32 for a signal line are arranged to perform display driving to the pixel sections 10R, 10G, and 10B, and the driving circuit 19D for sensor which drives the sensor sections 10S, and the detection circuit 8 which performs detection operation based on output from the sensor sections 10S are further arranged. Moreover, a picture signal processing circuit which performs predetermined correction processing to a picture signal input from the outside, and a timing generating circuit which controls the timing of the display driving and sensor driving (both circuits not shown in the drawings) are provided. Note that the peripheral circuits may be formed on the substrate in the same process as that for forming the pixels, or may be externally equipped using, for example, a driver IC.

The driving circuit 31 for a scanning line and a power source line has a scanning line driving circuit and a power source line driving circuit not shown in the drawings. The scanning line driving circuit sequentially selects the pixel sections 10R, 10G, and 10B by sequentially applying a selective pulse to a plurality of scanning lines WSL at a predetermined timing. Specifically, the scanning line driving circuit performs switching in a time-divisional manner between a voltage Von1 for setting a write transistor Tr1 described later in an ON state and a voltage Voff1 for setting the transistor Tr1 in an OFF state, to output those voltages Von1 and Voff1. The power source line driving circuit controls the emission operation and extinction operation of the pixel sections 10R, 10G, and 10B by sequentially applying a control pulse to a plurality of power source lines DSL at a predetermined timing. Specifically, the power source line driving circuit performs switching in a time-divisional manner between a voltage VH1 for flowing a current Ids to a driving transistor Tr2 described later and a voltage VL1 for not flowing the current Ids to the transistor Tr2, and to output those voltages VH1 and VL1.

The signal line driving circuit 32 generates an analog picture signal corresponding to a picture signal input from the outside and applies the picture signal to each signal line DTL at a predetermined timing. In this way, a picture signal is written to the pixel section 10R (or 10G or 10B) selected by the scanning line driving circuit.

The driving circuit 19D for sensor supplies driving signals Vs, Vs(1) to Vs(n) to the plurality of driving electrodes 19B for sensor in a line-sequential manner (one or the m-number of driving electrodes 19B for sensor make a unit driving line), for example. The driving circuit 19D for sensor has, for example, a shift register 19D1, a selecting section 19D2, a level shifter 19D3, and a buffer 19D4.

The shift register 19D1 is a logic circuit for sequentially transferring an input pulse. The selecting section 19D2 is a logic circuit which controls the decision whether or not the driving signal Vs is to be output to each display pixel 20 in the effective display region 100, and controls the output of the driving signal Vs according to such as the position of each pixel 20 in the effective display region 100. The level shifter 19D3 is a circuit which shifts a control signal supplied from the selecting section 19D2 to a potential level sufficient to control the driving signals Vs. The buffer 19D4 is a final output logic circuit which sequentially supplies the driving signals Vs (Vs(1) to Vs(n)), and includes an output buffer circuit or a switch circuit, for example.

(Example of Circuit Configuration of Pixel Sections)

Figure 5:
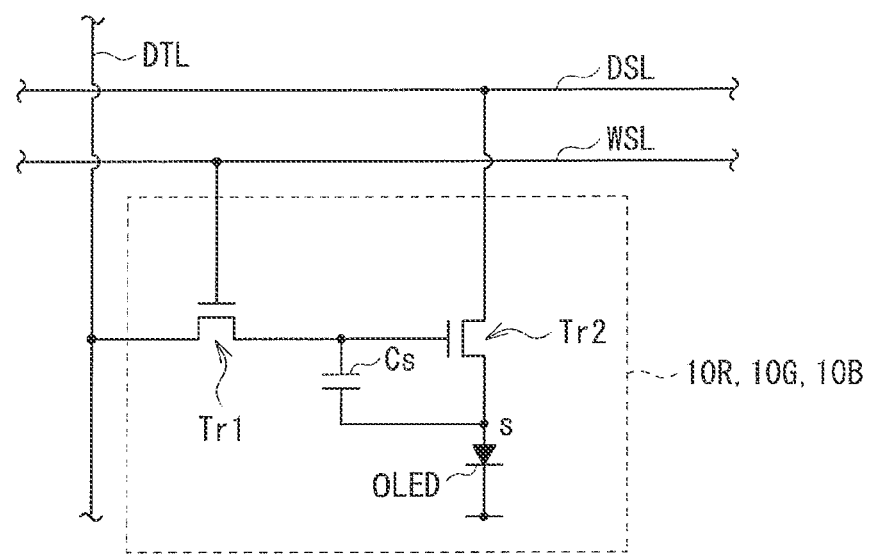
FIG. 5 is a diagram illustrating a circuit configuration of the pixel section shown in FIG. 1.

FIG. 5 illustrates an example of the circuit configuration of the pixel sections 10R, 10G, and 10B. Each of the pixel sections 10R, 10G, and 10B includes an organic EL element (OLED), a writing (sampling) transistor Tr1, a driving transistor Tr2, and a holding capacitor Cs. The writing transistor Tr1 and the driving transistor Tr2 are n-channel MOS (Metal Oxide Semiconductor) TFTs, for example. The type of the TFTs is not particularly limited and may be a reverse stagger structure (so-called bottom gate type) or a stagger structure (so-called top gate type).

In each of the pixel sections 10R, 10G, and 10B, the gate of the writing transistor Tr1 is connected to the scanning line WSL, the drain is connected to the signal line DTL, and the source is connected to the gate of the driving transistor Tr2 and one end of the holding capacitor Cs. The drain of the driving transistor Tr2 is connected to the power source line DSL, and the source is connected to the other end of the holding capacitor Cs and the anode of the organic EL element (OLED). The cathode of the organic EL element (OLED) is set at a fixed potential, which is a ground potential in this embodiment.

(Example Configuration of Detection Circuit 8)

Figure 6:
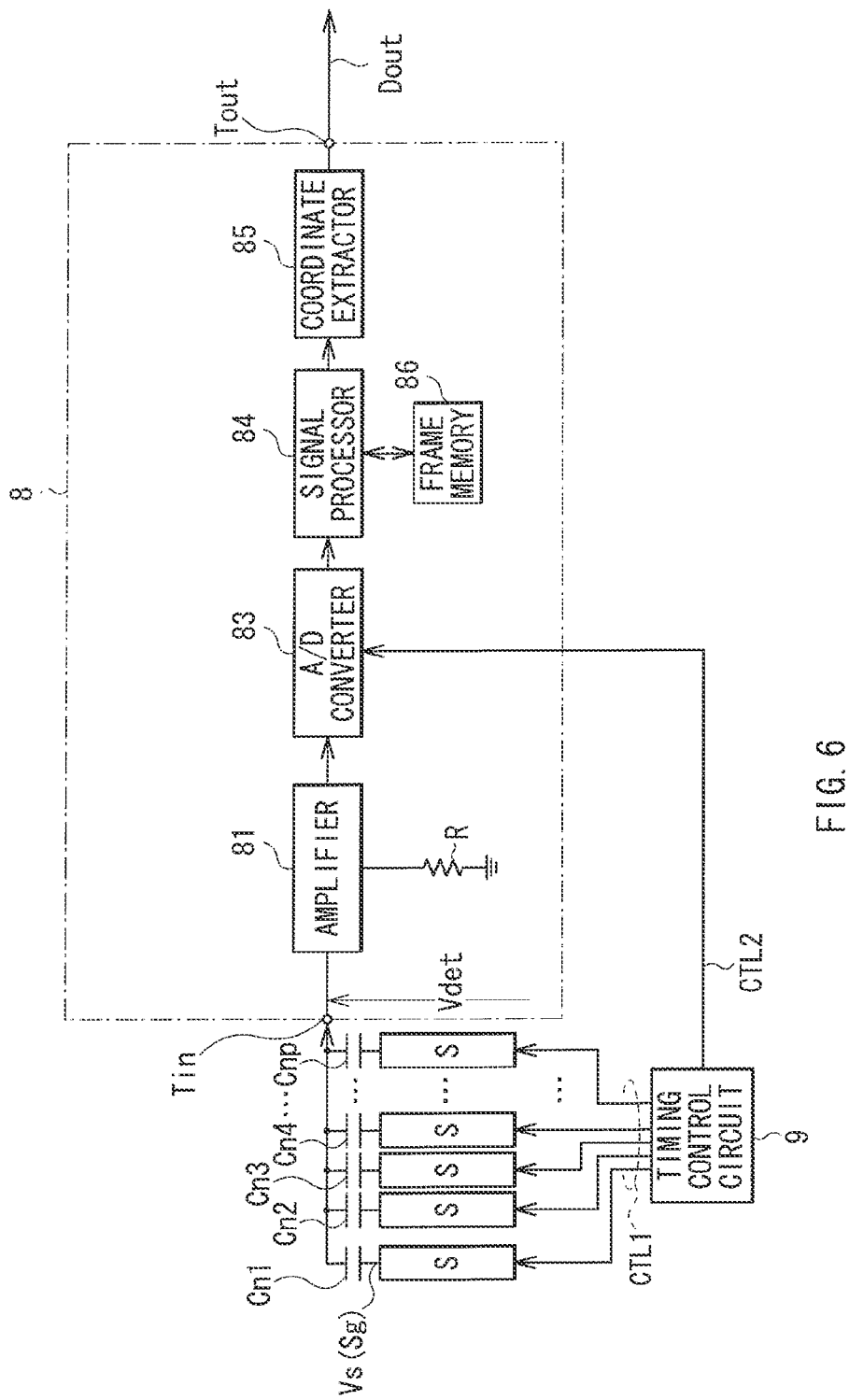
FIG. 6 is a function block diagram illustrating an example configuration of the detection circuit shown in FIG. 4.

FIG. 6 illustrates a function block configuration of the detection circuit 8 which performs object detecting operation and of the timing control circuit 9 as a timing generator. Capacitors Cn1 to Cnp correspond to the capacitor (capacitance) formed at the intersections of the driving electrodes 19B(1) to 19B(n) for sensor with the sensing electrodes 12(1) to 12(p). The capacitors Cn1 to Cnp are connected to the driving signal source S for supplying the driving signal Vs.

The detection circuit 8 (voltage detector DET) has, for example, an amplifier 81, an A/D (analog-to-digital) converter 83, a signal processor 84, a frame memory 86, a coordinate extractor 85, and a resistor R. The input terminal Tin of the detection circuit 8 is connected to the respective other ends of the capacitors Cn1 to Cnp on the sensing electrodes 12 side.

The amplifier 81 amplifies the detection signal Vdet input from the input terminal Tin, and includes such as, for signal amplification, an operational amplifier and capacitor. The resistor R is arranged between the amplifier 81 and the ground, and is for preventing the sensing electrodes 12 from becoming in a floating state and keeping the sensing electrodes 12 in a stable state. This makes it possible to prevent variation in the signal value of the detection signal Vdet in the detection circuit 8 and deliver the static electricity to the ground via the resistor R.

The A/D converter 83 converts the analog detection signal Vdet amplified by the amplifier 81 into a digital detection signal, and includes a comparator (not shown in the drawings). The comparator compares the respective potentials of an input detection signal and a predetermined threshold voltage Vth. The sampling timing at A/D conversion by the A/D converter 83 is controlled by a timing control signal CTL2 supplied from the timing control section 9.

The signal processor 84 performs, to the digital detection signal output from the A/D converter 83, predetermined signal processing such as digital noise elimination and conversion of frequency information into position information.

The coordinate extractor 85 determines the presence or absence of an object or the position (coordinates) of an object based on the detection signal output from the signal processor 84, and outputs the decision as a detection result (detection signal Dout) from the output terminal Tout.

The detection circuit 8 may be formed in a peripheral region (non-display region or frame region) on the sealing substrate 24 or may be formed in a peripheral region on the transparent substrate 11. Forming the detection circuit 8 on the transparent substrate 11 is more preferable in terms of simplification by integration since it achieves integration between the detection circuit 8 and the various types of driving circuits for display control which have been originally formed on the transparent substrate 11. Further, the above configuration of the detection circuit 8 is an example and the configuration is not limited to the one described above.

[Operations and Advantages of Organic EL Display Device 1]

(Image Display Operation)

First, the image display operation of the organic EL display device 1 will be described with reference to FIGS. 1 and 4. In the organic EL display device 1, the driving circuit 31 for a scanning line and a power source line as well as the driving circuit 32 for a signal line perform display driving to the pixel sections 10R, 10G, and 10B in the effective display region 100. Thus, a driving current is injected into an organic layer (white light emitting layer in this embodiment) in the pixel sections 10R, 10G, and 10B, and white light emission occurs by recombination of holes and electrons. Respective white light beams emitted from the pixel sections 10R, 10G, and 10B pass through the pixel electrodes 19A and then pass through their corresponding color filter layers (red filter layer 17R, green filter layer 17G, and blue filter layer 17B), so that the light beams are emitted as a red light, a green light, and a blue light from below the transparent substrate 11. In this way, color images are displayed in the pixel sections 10R, 10G, and 10B.

(Object Detection Operation)

On the other hand, in the organic EL display device 1, the driving circuit 19D for sensor supplies the diving signal Vs to each of the driving electrodes 19B (19B(1) to 19B(n)) for sensor in a line-sequential manner. At this time, the sensor section 10S having the capacitor C1 between the sensing electrode 12 and the driving circuit 19D for sensor detects a contacting object or an approaching object as below.

(Basic Principle)

Figure 7:
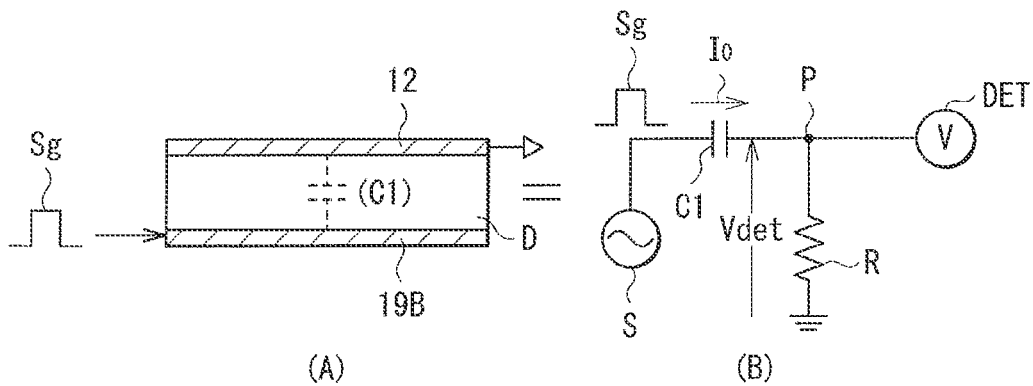
FIG. 7 is a conceptual diagram for describing a principle of an object detection operation, which illustrates the situation without finger contact.
Figure 8:
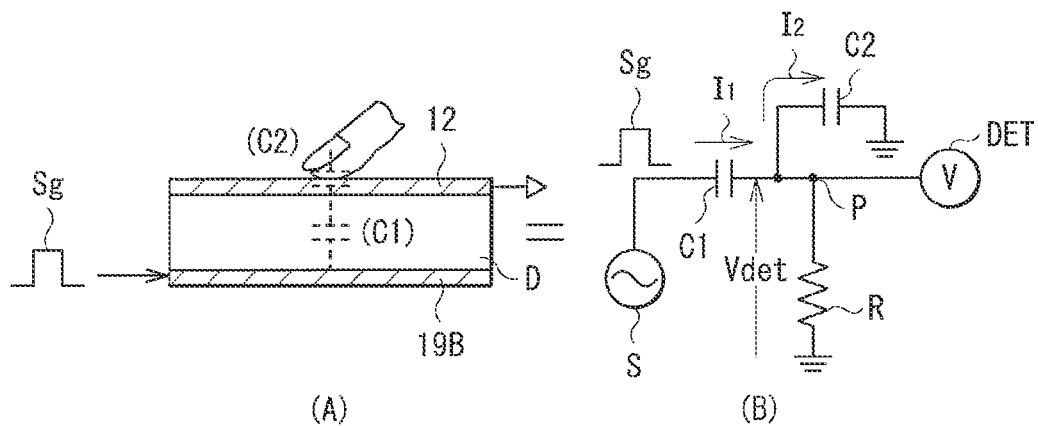
FIG. 8 is a conceptual diagram for describing the principle of the object detection operation, which illustrates the situation with finger contact.
Figure 9:
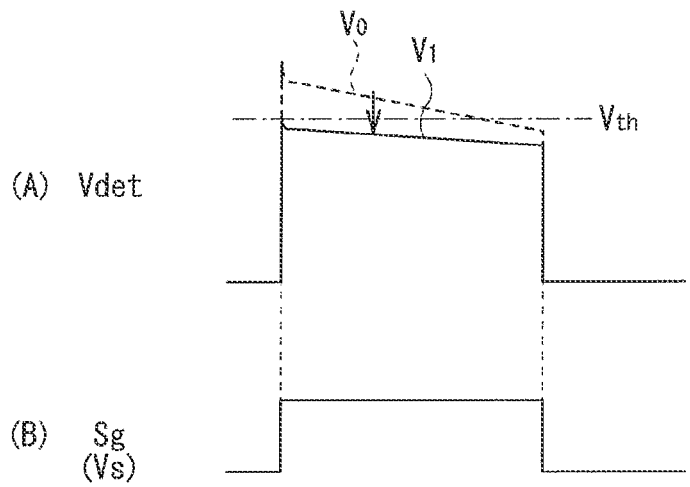
FIG. 9 is a conceptual diagram for describing the principle of the object detection operation, which illustrates an example of a waveform of each of the driving signal for sensor and the detection signal.

FIGS. 7 to 9 are schematic drawings for describing a basic principle of the object detection operation. As shown in (A) of FIG. 7, the capacitor C1 is formed between the driving electrode 19B for sensor and the sensing electrode 12 which face each other across a dielectric D (equivalent to the planarization film 18), and this configuration is expressed as an equivalent circuit as shown in (B) of FIG. 7. The capacitor C1 is connected to an alternating signal source (driving signal source) S at one end of the capacitor C1, and is connected to the voltage detector (detection circuit) DET as well as being connected to the ground at the other end P thereof via the resistor R. When an alternating and rectangular wave Sg, as shown in (B) of FIG. 9, with a predetermined frequency (approximately from several kHz to a few ten kHz, for example) is applied from the alternating signal source S to the driving electrode 19B for sensor (one end of the capacitor C1), an output waveform (detection signal Vdet) as shown in (A) of FIG. 9 appears in the sensing electrode 12 (the other end P of the capacitor C1). The alternating and rectangular wave Sg is equivalent to a driving signal Vs described later in this embodiment.

When a finger is not in contact or in proximity, a current $I_o$ for the capacitance value of the capacitor C1 flows with charge and discharge to the capacitor C1, as shown in (B) of FIG. 7. The potential waveform at this time of the capacitor C1 at its other end P is expressed by, for example, the waveform $V_o$ shown in (A) of FIG. 9 and is detected by the voltage detector DET.

On the other hand, when a finger is in contact or in proximity, a capacitor C2 formed by an object (for example, a finger) becomes equivalent to the capacitor C1 by being added to the capacitor C1 in series, as shown in FIG. 8. In this situation, currents $I_1$ and $I_2$ flow with charge and discharge to the capacitors C1 and C2. The potential waveform at this time of the capacitor C1 at its other end P is expressed by, for example, the waveform $V_1$ shown in (A) of FIG. 9 and is detected by the voltage detector DET. The potential at this time of the point P is a partial pressure potential determined by the currents $I_1$ and $I_2$ flowing in the capacitors C1 and C2, respectively. Accordingly, the waveform V1 is smaller than the waveform V0 when an object is not in contact. By detecting the change in the waveform (the change in voltage value), it is possible to detect an object in contact or in proximity.

Figure 10:
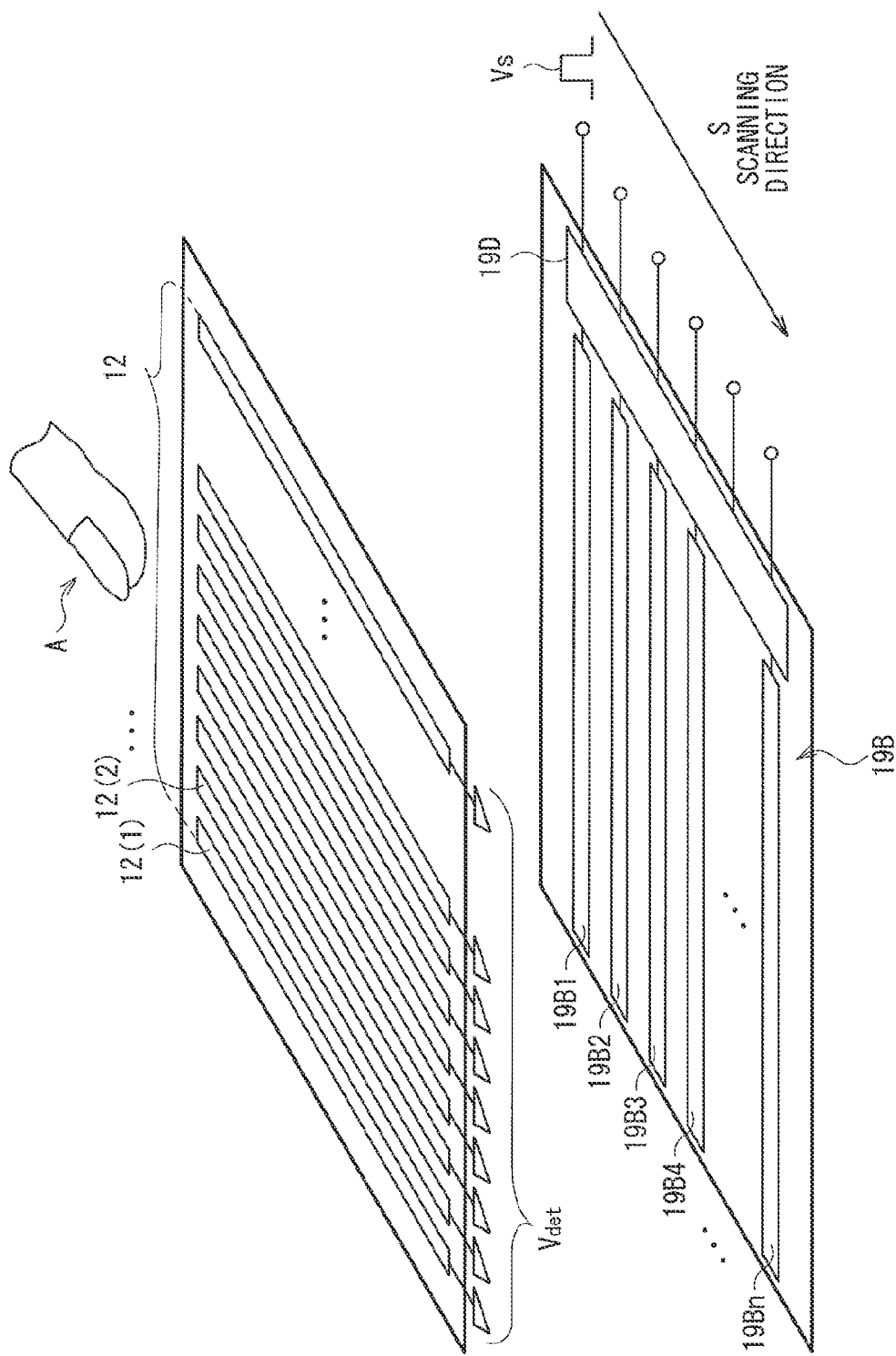
FIG. 10 is a schematic diagram for describing an object detection operation by line-sequential driving of the sensor section.

In this embodiment, the capacitor C1 is formed at each of the intersections (sensor sections 10S) of the n-number of driving electrodes 19B(1) to 19B(n) for sensor with the p-number of sensing electrodes 12(1) to 12(p). As shown in FIG. 10, when the driving electrodes 19B(1) to 19B(n) for sensor are sequentially scanned along the direction S to apply the driving signal Vs to the driving electrodes 19B(1) to 19B(n) for sensor in a time-division manner, the following result is obtained, for example. It is to be noted here that the driving electrodes 19B(1) to 19B(n) for sensor are electrically separated and each of the driving electrodes 19B for sensor makes a unit driving line.

When the driving signal Vs is applied in a line-sequential manner to the driving electrodes 19B(1) to 19B(n) for sensor, charging and discharging are performed to each of the plurality of (p-number in this case) capacitors Cn1 to Cnp formed at the intersections of the sensing electrodes 12(1) to 12(p) with the driving electrodes 19B for sensor to which the driving signal Vs is being applied at a certain timing. As a result, a detection signal Vdet with a magnitude corresponding to the capacitance value of the capacitors C1 is output from each of the sensing electrodes 12(1) to 12(p). Further, the capacitors C1 to be charged and discharged sequentially moves from one line to another with the scanning using the driving signal Vs.

While the scanning with the driving signal Vs is being carried out, the magnitude of the detection signal Vdet is nearly uniform if a finger of a user, for example, is not present on the surface of the transparent substrate 11.

On the other hand, when a finger of a user is in contact with or in proximity to the surface of the transparent substrate 11, the capacitor C2 formed by the finger is added to the capacitor C1 initially formed in the part where the finger is in contact with or in proximity thereto. Consequently, the value of the detection signal Vdet at the time when the contacting part (or the proximity part) is scanned (i.e., at the time when the driving signal Vs is applied to the driving electrodes 19B for sensor that correspond to the contacting part (or the proximity part) among the driving electrodes 19B(1) to 19B(n) for sensor) becomes smaller than that of the other part. The detection signal Vdet thus obtained via the sensing electrode 12 is output to the detection circuit 8.

The detection circuit 8 makes a comparison between the voltage of the thus-obtained detection signal Vdet and the predetermined threshold voltage Vth, and determines that an object is not in contact (or is not in proximity) if the voltage of the detection signal Vdet is not smaller than the threshold voltage Vth and that an object is in contact (or is in proximity) if the voltage of the detection signal Vdet is smaller than the threshold voltage Vth. In this way, the object detection operation is performed. Incidentally, the part (positional coordinates) where an object is in contact or in proximity may be found from the timing of applying the driving signal Vs and the timing of detecting the detection signal Vdet with a voltage lower than the threshold voltage Vth.

As described above, the organic EL display device 1 of the bottom emission type according to the present embodiment includes: the plurality of pixel electrodes 19A; the organic layer 21 having the light emitting layer; the upper electrode 22; and the sealing substrate 24 in this order on the transparent substrate 11, and further includes, between the transparent substrate 11 and the sealing substrate 24, the sensing electrode 12 and the driving electrode 19B for sensor in this order from the transparent substrate 11 side. The sensing electrode 12 forms a capacitance (capacitor C1) with the driving electrode 19B for sensor. In other words, in this embodiment, the pixel sections 10R, 10G, and 10B which perform image display and the sensor sections 10S which perform object detection are provided in a mixed fashion. With this layout, when display driving is performed to the pixel sections 10R, 10G, and 10B, light emitted from the organic layer 21 is drawn from the transparent substrate 11 side (an image is display on the transparent substrate 11 side). On the other hand, when the sensor sections 10S are driven, the presence or absence of an object in contact with or in proximity to the transparent substrate 11 serving as a display screen is detected (object detection is performed on the transparent substrate 11 side). In this way, object detection is allowed without externally mounting a touch panel module on the transparent substrate 11. Hence, an organic EL display device equipped with a touch sensor function is achieved without increasing the thickness of the entire device.

Further, providing the driving electrodes 19B for sensor in the same layer as the layer of the pixel electrodes 19A in the pixel sections 10R, 10G, and 10B makes it possible to easily form the pixel electrodes 19A and the driving electrodes 19B for sensor by patterning in the same process. Further, forming the pixel electrodes 19A and the driving electrodes 19B for sensor in the same layer makes the device thinner than forming these electrodes in different layers.

Next, modifications (first to third modifications) of the organic EL display device according to the first embodiment will be described. It is to be noted that the components of substantially the same functions as those in the first embodiment are denoted with the same reference numerals as those in the first embodiment for adequate omission of descriptions.

<First Modification>

Figure 11:
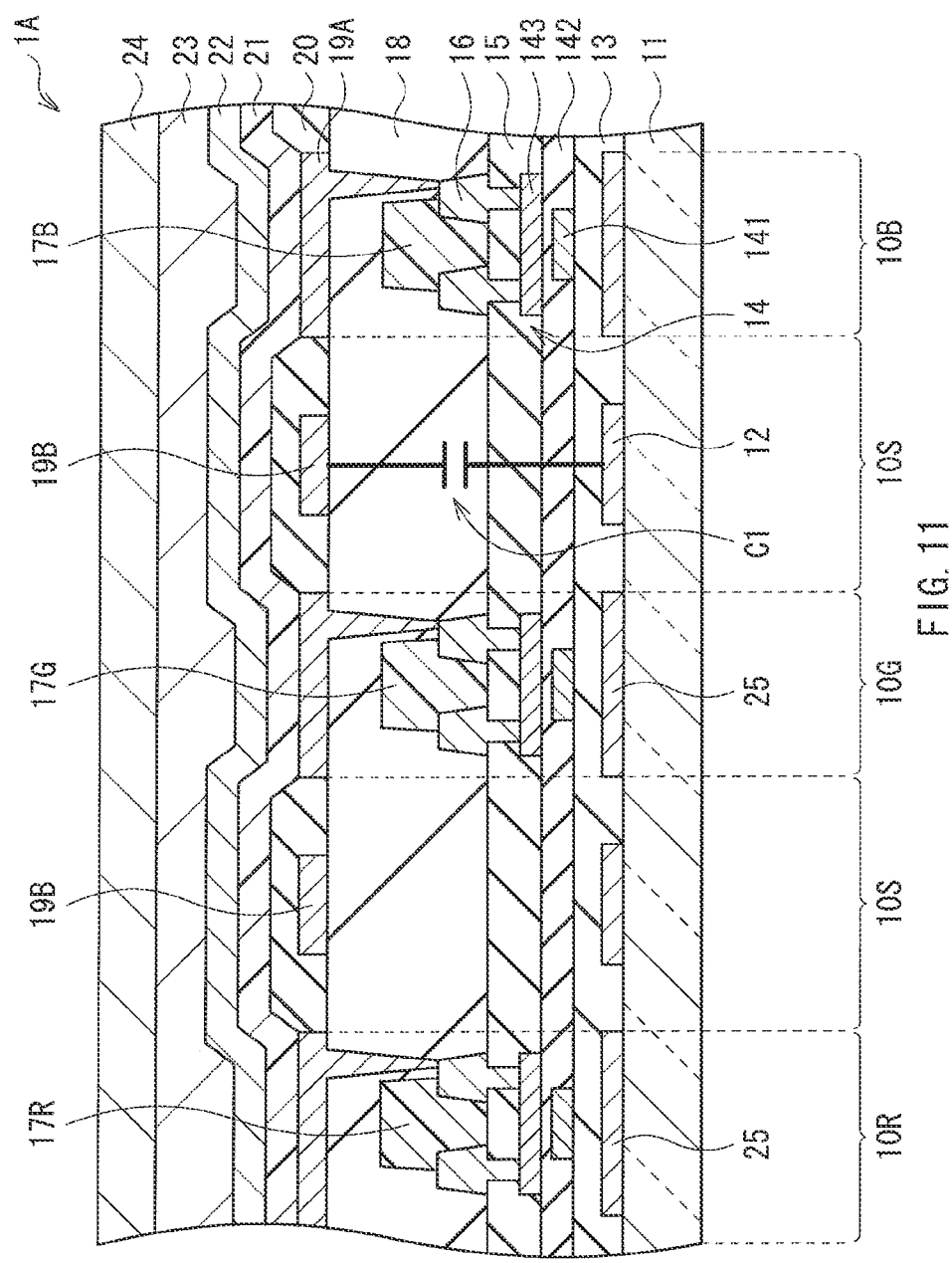
FIG. 11 is a cross-sectional view illustrating a general configuration of an organic EL display device according to a first modification.

FIG. 11 illustrates a cross-sectional configuration of an organic EL display device (organic EL display device 1A) according to a first modification. The organic EL display device 1A includes a plurality of organic EL elements of the bottom emission type as display pixels, and has a touch sensor function of a capacitance type, as the organic EL display device 1 of the first embodiment does. Specifically, the organic EL display device 1A includes, on the transparent substrate 11, the sensor section 10S in selective regions among the pixel sections 10R, 10G, and 10B. Further, the driving electrodes 19B for sensor are provided in the same layer as that of the pixel electrodes 19A.

In the first modification, a metal 25 for preventing leakage (hereinafter referred to as leakage prevention metal 25) is arranged in the same layer (between the transparent substrate 11 and the insulating film 13) as that of the sensing electrodes 12 in the pixel sections 10R, 10G, and 10B. The leakage prevention metal 25 is for preventing generation of leakage currents in the transistor section 14 (transistor Tr1 in FIG. 5) under the influence of outside light incoming from below the substrate 11 in the bottom emission scheme. The leakage prevention metal 25 is arranged to face the transistor section 14 between the transparent substrate 11 and the insulating film 13 so as to block outside light incoming to the transistor section 14. The leakage prevention metal 25 is formed of, for example, molybdenum. The sensing electrodes 12 intersect with the driving electrodes 19B for sensor in a stripe pattern in the spaces among the leakage prevention metals 25.

Further, in the present modification, the leakage prevention metals 25 and the sensing electrodes 12 may be formed in the same process by, for example, forming the metal material described above on the entire surface of the transparent substrate 11 and then creating the above layout pattern at one time by a photography technique.

In the organic EL display device 1A in which the leakage prevention metals 25 are arranged in the pixel sections 10R, 10G, and 10B, it is possible to provide the sensing electrodes 12, using the layer in which the leakage prevention metals 25 are thus arranged. Further, since it is possible to form the leakage prevention metals 25 and the sensing electrodes 12 by patterning in the same process, the number of processes or cost of additional material does not increase. Utilizing, as the driving electrodes 19B for sensor and the sensing electrodes 12, electrodes (such as the pixel electrodes 19A) initially arranged in the organic EL display device and a metal (used for other purpose such as the leakage prevention metals 25) for use in sensor achieves a thin organic EL display device provided with a touch sensor function without increasing the number of processes or cost, as in the present modification example.

<Second Modification>

Figure 12:
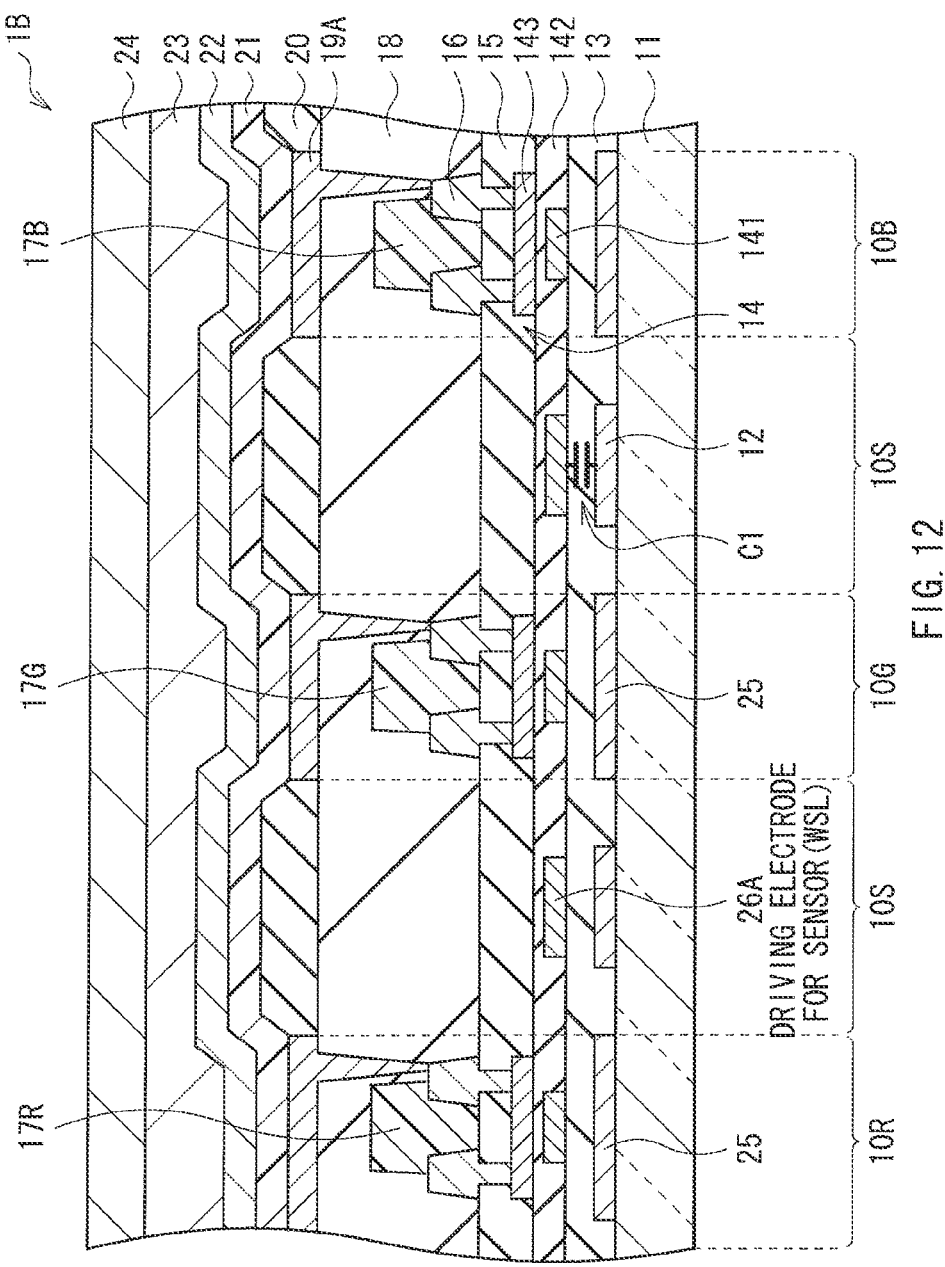
FIG. 12 is a cross-sectional view illustrating a general configuration of an organic EL display device according to a second modification.

FIG. 12 illustrates a cross-sectional configuration of an organic EL display device (organic EL display device 1B) according to a second modification. The organic EL display device 1B includes a plurality of organic EL elements of the bottom emission type as display pixels, and has a touch sensor function of a capacitance type, as the organic EL display device 1 of the first embodiment does. Specifically, the organic EL display device 1B includes, on the transparent substrate 11, the sensor section 10S in the selective regions among the pixel sections 10R, 10G, and 10B. In the second modification, the leakage prevention metals 25 described in the first modification are also arranged.

Figure 13:
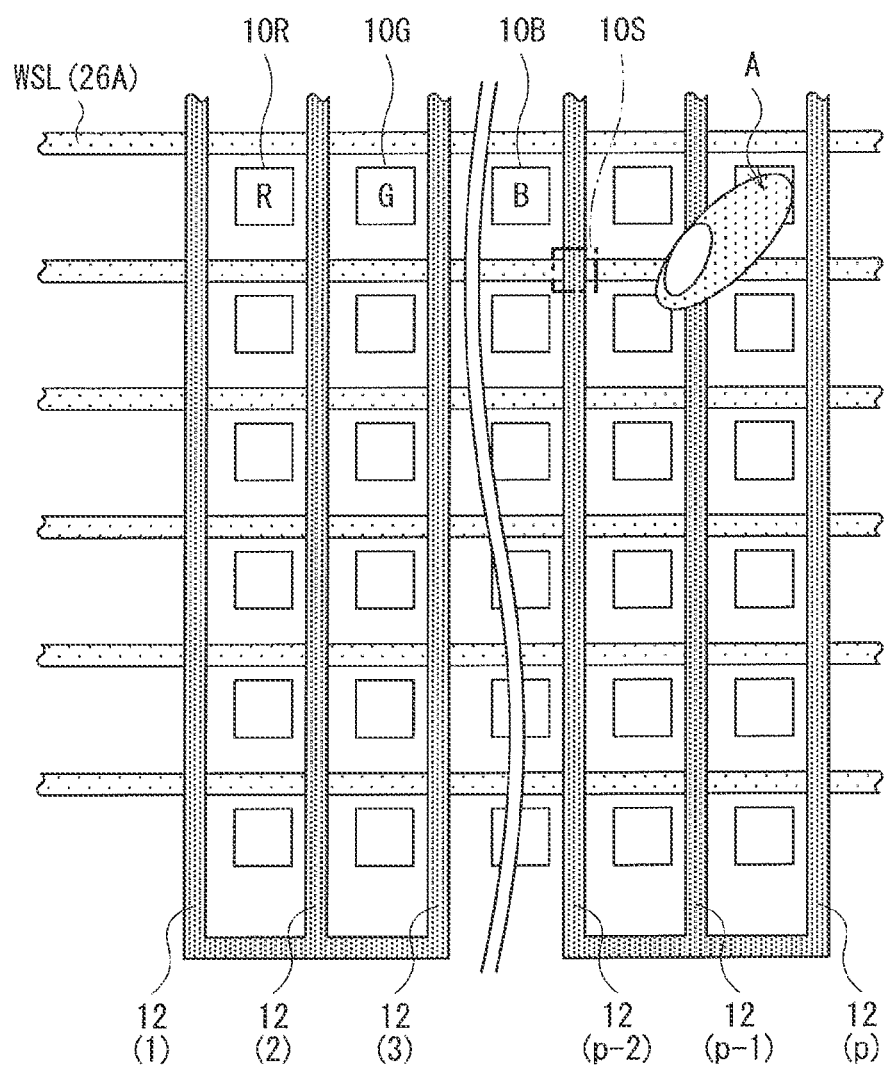
FIG. 13 is a plan schematic view illustrating an example layout of the scanning lines and the sensing electrodes shown in FIG. 12.

Unlike the first embodiment and the first modification, in the second modification, a driving electrode 26A for sensor is provided using a scanning line WSL. In other words, a metal layer forming the scanning line WSL serves as the driving electrode 26A for sensor. The driving electrode 26A for sensor is provided in the same layer as that of the gate electrode 141 in the transistor section 14 and is made of the same material as that of the gate electrode 141, for example. FIG. 13 illustrates an example layout of the scanning lines WSL (driving electrodes 26A for sensor) and the sensing electrodes 12. As shown in the layout, the scanning lines WSL (26A) are arranged in the regions among the pixel sections 10R, 10G, and 10B so as to extend in one direction, and the sensing electrodes 12(1) to 12(*p*) are provided in a direction in which the sensing electrodes 12 intersect with the scanning lines WSL (26A). In this way, the capacitor C1 is formed at the intersections of the sensing lines WSL (26A) with the sensing electrodes 12, and the intersections make the sensor sections 10S.

In the above configuration, a driving signal for display which drives display of the pixel sections 10R, 10G, and 10B is applied to the scanning lines WSL (26A) in a line-sequential manner, and this display driving signal may be used as a driving signal for sensor. In this case, charging and discharging are performed to the capacitor C1 formed at the intersections of one of the scanning lines WSL (26A) to which the driving signal is being applied and the sensing electrodes 12, in synchronization with the timing of driving display of the pixel sections 10R, 10G, and 10B. Alternatively, the driving signal for display and the driving signal for sensor may be sequentially applied at different timings. For example, scanning for image display and scanning for sensor may be performed in the upper part and lower part of the screen, respectively.

The scanning line WSL may serve as the driving electrode for sensor, as in the driving electrode 26A for sensor in the present modification. In this case, the driving electrode 26A for sensor forms a capacitance (the capacitor C1) with the sensing electrode 12, making it possible to obtain the same advantages as in the first embodiment. Further, since an existing driving signal for display may be used as the driving signal for sensor, it is unnecessary to additionally provide the driving circuit 19D for sensor as shown in FIG. 4 as a peripheral circuit, achieving simplification of the configuration of the device.

Figure 14:
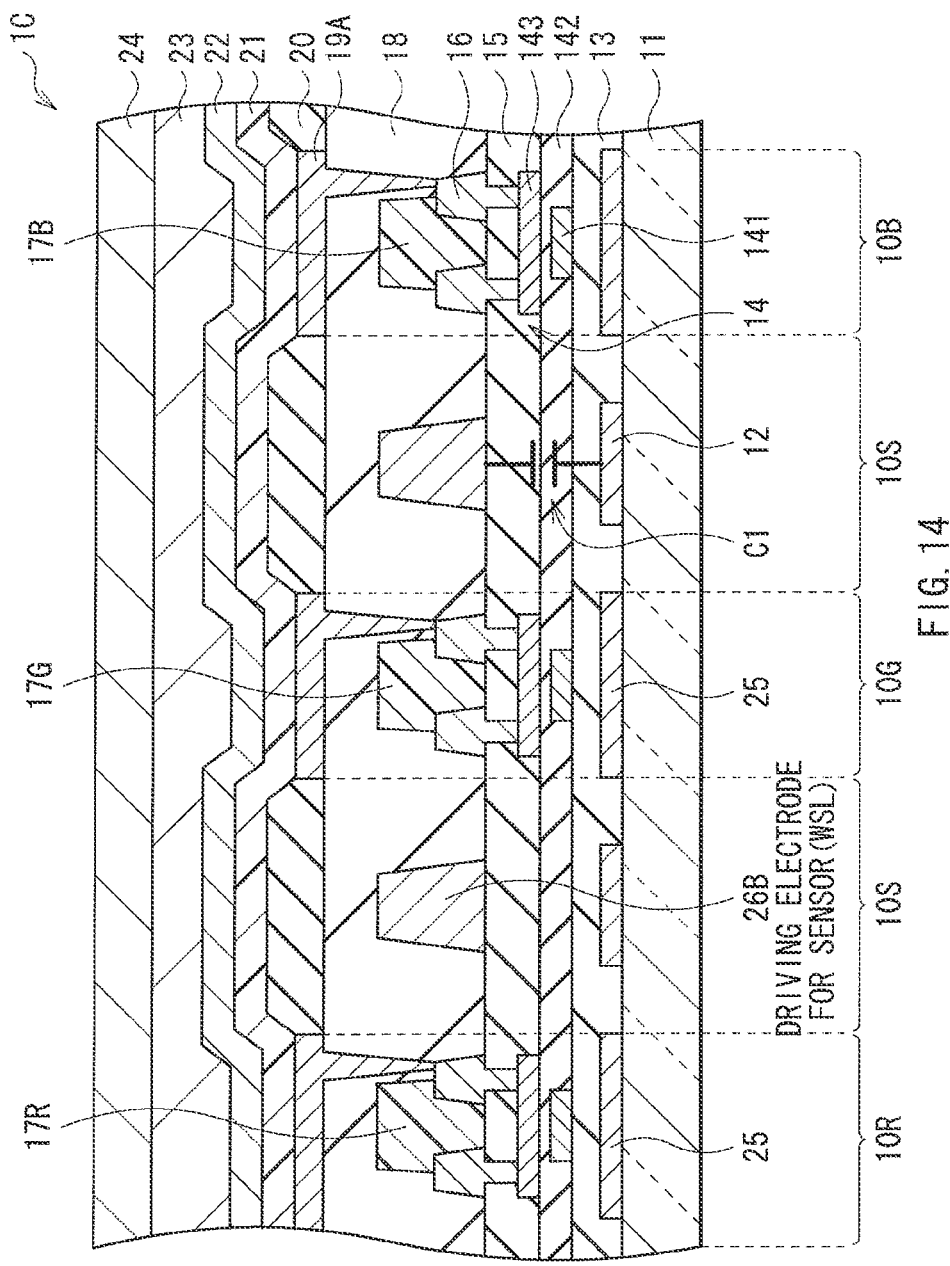
FIG. 14 is a cross-sectional view illustrating another example of the configuration of the driving electrodes for sensor shown in FIG. 12.

Further, when the scanning line WSL is used as the driving electrode for sensor as in the second modification, the driving electrode for sensor (driving electrode 26B for sensor) may be provided on the interlayer insulating film 15 as shown in FIG. 14, for example. In this case, the driving electrode 26B for sensor is formed of the same material as, for example, aluminum (Al).

<Third Modification>

Figure 15:
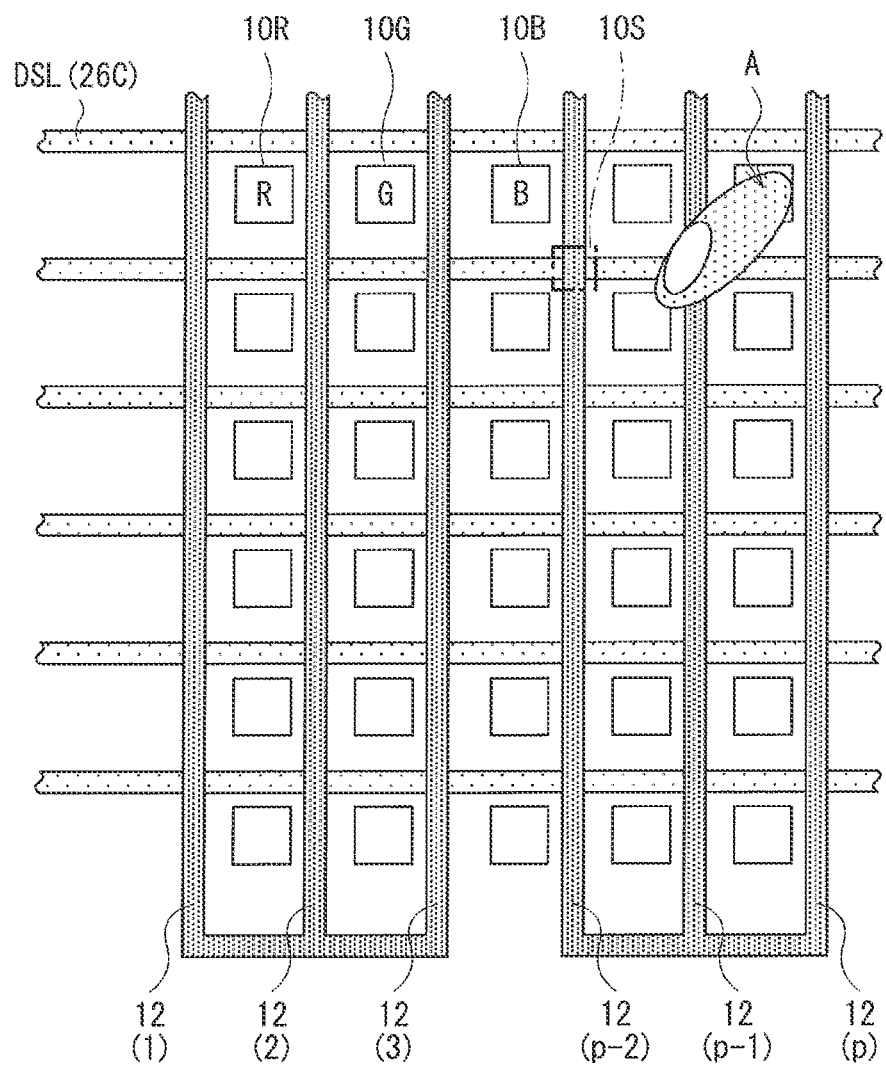
FIG. 15 is a plan schematic view illustrating an example layout of the power source lines and the sensing electrodes in an organic EL display device according to a third modification.

Although in the second modification, the scanning line WSL is used as the driving electrode for sensor, the power source line DSL may be used as the driving electrode for sensor. In other words, the metal layer forming the power source line DSL may serve as the driving electrode for sensor (driving electrode 26C for sensor). This case also achieves the same advantages as in the first embodiment and the second modification. FIG. 15 illustrates an example layout of the power source lines DSL (driving electrodes 26C for sensor) and the sensing electrodes 12. In the case of FIG. 15, as in the second modification, the power source line DSL (26C) is arranged in the regions among the pixel sections 10R, 10G, and 10B so as to extend in one direction, and the sensing electrodes 12(1) to 12(*p*) are provided in a direction in which the sensing electrodes intersect with the power source lines DSL (26C). Thus, the capacitor C1 is formed at the intersections of the power source lines DSL (26C) with the sensing electrodes 12 and the intersections make the sensor section 10S. The power source lines DSL (26C), in the scanning lines WSL (26A and 26B) described above, are provided in the same layer as that of the gate electrode 141 or on the interlayer insulating film 15, and form a capacitance (the capacitors C1) with the sensing electrodes 12.

Further, a driving signal for a power source line is applied to the power source lines DSL (26C) in a line-sequential manner, and the driving signal for a power source line may be used as the driving signal for sensor. In this case, charging and discharging are performed to the capacitors C1 formed at the intersections of one of the power source lines DSL (26C) to which the driving signal for a power source line is being applied and the sensing electrodes 12, in synchronization with the timing of applying the driving signal for a power source line. Alternatively, the driving signal for a power source line and the driving signal for sensor may be sequentially applied at different timings. For example, scanning for a power source line and scanning for sensor may be performed in the upper part and the lower part of the screen, respectively.

<Fourth Modification>

Figure 16:
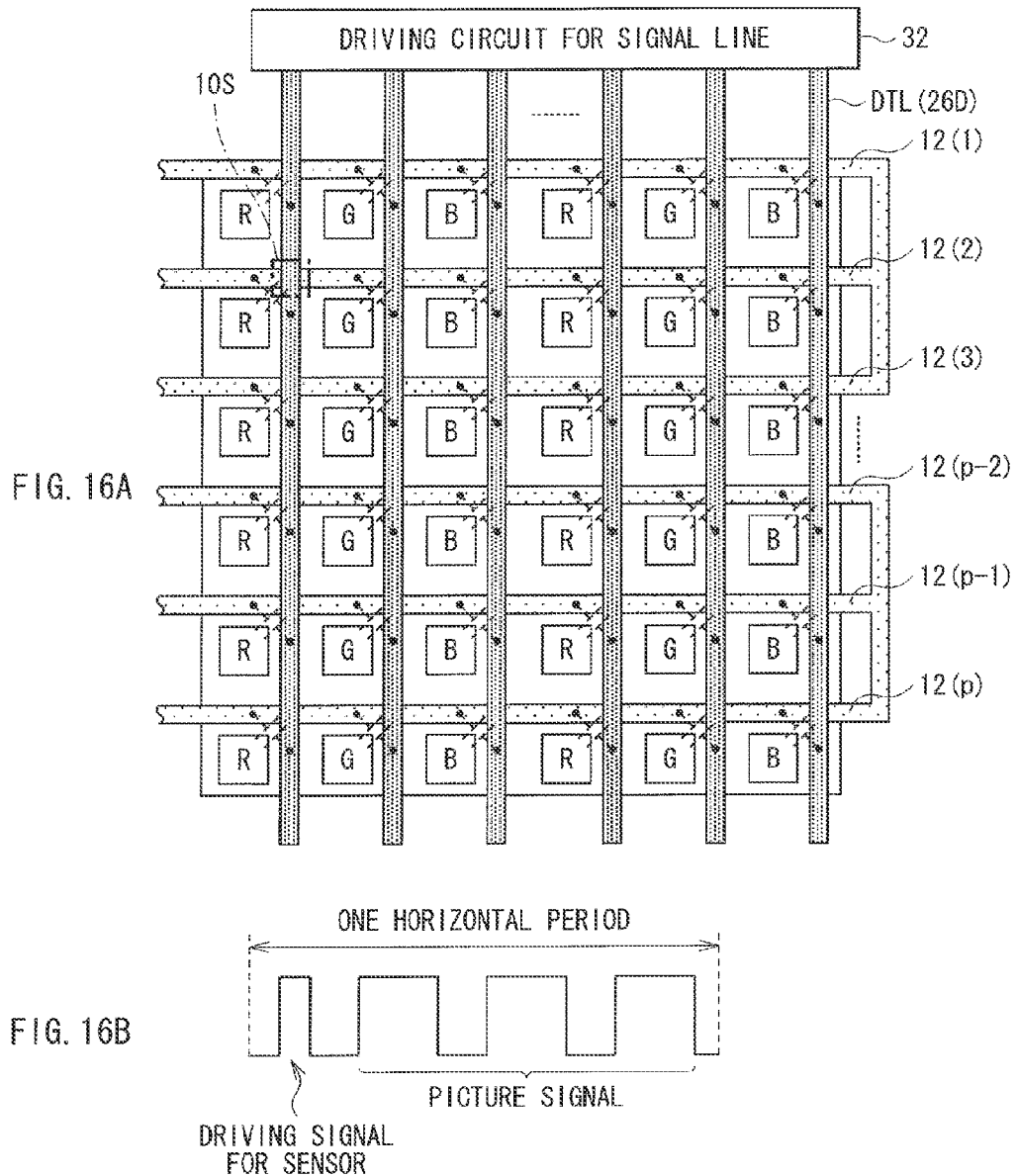
FIG. 16A is a plan schematic view illustrating an example layout of the signal lines and the sensing electrodes in an organic EL display device according to a fourth modification.
FIG. 16B is a schematic diagram for describing a signal writing operation.

Although the second and third modifications are examples in which the scanning line WSL or power source line DSL is used as the driving electrode for sensor, the signal line DTL may be used as the driving electrode for sensor. In other words, the metal layer forming the signal line DTL may serve as the driving electrode for sensor (driving electrode 26D for sensor). This case also achieves the same advantages as in the first embodiment, second, and third modifications. FIG. 16A illustrates an example layout of the signal lines DTL (driving electrodes 26D for sensor) and the sensing electrodes 12. In the case of FIG. 16A, as in the second and third modifications, the signal line DTL (26D) is arranged in the regions among the pixel sections 10R, 10G, and 10B so as to extend in one direction, and the sensing electrodes 12(1) to 12(p) are provided in a direction in which the sensing electrodes 12 intersect with the signal lines DTL (26D). Thus, the capacitor C1 is formed at the intersections of the signal lines DTL (26D) with the sensing electrodes 12, and the intersections make the sensor sections 10S. The signal lines DTL (26D), as in the scanning lines WSL (26A and 26B) described above, are provided in the same layer as that of the gate electrode 141 or on the interlayer insulating film 15, and form a capacitance (the capacitors C1) with the sensing electrodes 12.

A picture signal is applied to the signal lines DTL (26D) in a line-sequential manner. In the line-sequential driving method of the three-selector type, a picture signal of a red color, a picture signal of a green color, and a picture signal of a blue color are written in each horizontal period, and a period of writing a driving signal for sensor may be provided separately from the period of writing the picture signals. FIG. 16B shows an example in which a driving signal for sensor is sequentially applied to specific signal lines DTL in one horizontal period. The driving signal may be applied to the specific signal lines DTL one by one, or may be applied to plural ones of the specific signal lines DTL at one time. In this manner, charging and discharging are performed to the capacitor C1 formed at the intersections of one or plural signal lines DSL (26D) to which the driving signal is being applied and the sensing electrodes 12, in synchronization with the timing of applying the driving signal for sensor.

Next, an organic EL display device (organic EL display device 2) according to a second embodiment of the present disclosure will be described.

Second Embodiment

Example Configuration of Organic EL Display Device 2

Figure 17:
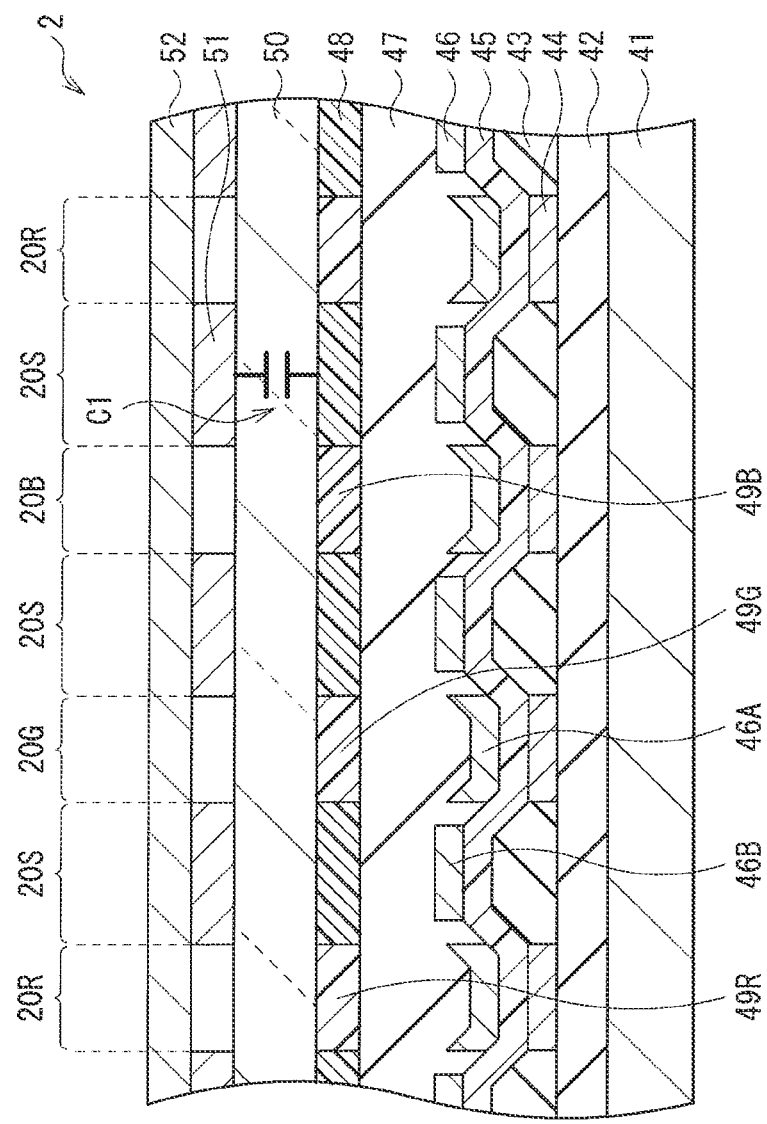
FIG. 17 is a cross-sectional view illustrating a schematic configuration of an organic EL display device according to a second embodiment.

FIG. 17 illustrates a cross-sectional configuration of an organic EL display device 2. The organic EL display device 2 includes a plurality of organic EL elements of the top emission type as display elements, and has a touch sensor function of a capacitance type. The organic EL display device 2 further includes, on a substrate 41, pixel sections 20R, 20G, 20B, and sensor sections 20S. The pixel sections 20R, 20G, and 20B include organic EL elements of red, green, and blue colors, respectively. The sensor section 20S is provided in selective regions among the pixel sections 20R, 20G, and 20B. In other words, in the organic EL display device 2, the pixel sections 20R, 20G, 20B, and sensor sections 20S are disposed in the display region in a mixed fashion. The substrate 41 and a sealing substrate 50 in the present embodiment are examples of the "first substrate" and "second substrate", respectively, in the second display device according to one embodiment of the present disclosure. Further, a pixel electrode 44 and a common electrode 46A for display described later are example of the "first electrode" and "second electrode", respectively, in the second display device according to one embodiment of the disclosure. Hereinafter, a cross-sectional configuration etc. of each part will be described. The circuit configuration of the pixel sections 20R, 20G, and 20B and the peripheral circuits (driving circuit 31 for a scanning line and a power source line, driving circuit 32 for a signal line, driving circuit 19D for sensor, and detection circuit 8) are the same as in the first embodiment.

(Example of Cross-Sectional Configuration of Pixel Sections)

In the pixel sections 20R, 20G, and 20B, a planarization film 42 is formed on the substrate 41 with a transistor section and a wiring layer (not shown in FIG. 17), for example, interposed therebetween. The transistor section and the wiring layer correspond to the transistor section 14, interlayer insulating film 15, and source-drain electrode layer 16. A plurality of pixel electrodes 44 are arranged on the planarization film 42, and the regions corresponding to the pixel electrodes 44 are the pixel sections 20R, 20G, and 20B.

The pixel electrodes 44 each function as an anode for injecting holes into an organic layer 45 (white light emitting layer) described later. Each pixel electrode 44 is formed of reflective metal material, more specifically, a single metal element such as silver (Ag), aluminum (Al), molybdenum (Mo) and chromium (Cr) or an alloy thereof, for example. The pixel electrode 44 may be a single layer film using the metal material, or a lamination film of at least two types of the above metal elements. On the pixel electrodes 44, a pixel separation film (window film) 43 having openings in positions corresponding to the pixel electrodes 44 is provided. The pixel separation film 44 is for defining an emission region of a pixel, and may be made of the same material as that of the pixel separation film 20 in the first embodiment. The organic layer 45 is formed on the pixel separation film 44 over, for example, the entire surface of the substrate.

The organic layer 45 is common to the pixel sections 20R, 20G, and 20B, and includes a white light emitting layer which emits white light by recombination of holes and electrons. For example, a hole injection layer, a hole transport layer, and an electron transport layer (not shown in the drawings), may be laminated on the organic layer 45, other than the white light emitting layer. Further, light emitting layers emitting lights of different colors may be painted differently for the pixel sections 20R, 20G, and 20B (red light emitting layer, green light emitting layer, and blue light emitting layer), instead of the white light emitting layer. A common electrode 46A for display is provided on the region of the organic layer 45 which corresponds to each of the pixel sections 20R, 20G, and 20B. Moreover, a driving electrode 46B for sensor described later is arranged on the region of the organic layer 45 which corresponds to each sensor section 20.

The common electrode 46A for display is an electrode common to the pixel sections 20R, 20G, and 20B (electrode electrically connected to the pixel sections), and functions as a cathode for injecting electrons into the organic layer 45, for example. The common electrode 46A for display is formed of, for example, a transparent conductive film made of such as ITO and IZO, and transmits, toward an upper part (on the sealing substrate 50 side), the light emitted from the organic layer 46. Alternatively, the common electrode 46A for display may be formed of a signal layer film or a lamination film of a co-evaporated film of magnesium (Mg) and silver (Ag), for example. Furthermore, an electron injection layer may be provided between the common electrode 46A for display and the organic layer 45. The layout configuration of the common electrode 46A for display and the driving electrode 46B for sensor will be described later.

On the common electrode 46A for display, a protective layer 47 made of, for example, a silicon nitride film or a silicon oxide film and serving to seal and protect the pixel sections 20R, 20G, and 20B is provided. On the protective layer 47, color filter layers (red filter layer 49R, green filter layer 49G, and blue filter layer 49B) of the colors corresponding to the pixel sections 20R, 20G, and 20B are provided in regions corresponding to the pixel sections 20R, 20G, and 20B, respectively. A black matrix (BM) layer 48 is provided in regions (regions corresponding to the sensor sections 20S) among the red filter layer 49R, green filter layer 49G, and blue filter layer 49B.

The red filter layer 49R, green filter layer 49G, and blue filter layer 49B are each made of, for example, light-sensitive resin containing pigment, and the BM layer 48 is made of, for example, insulating material containing light-sensitive resin material and light-blocking material. A sealing substrate 50 is arranged on the color filter layers and the BM layer 48.

(Example of Cross-Sectional Configuration of Sensor Sections)

Since the sensor sections 20S are provided in the regions among the pixel sections 20R, 20G, and 20B as described above, the sensor sections 20S share most of their layers with the pixel sections 20R, 20G, and 20B, and have the driving electrodes 46B for sensor in a certain layer between the substrate 41 and the sealing substrate 50. Further, a sensing electrode 51 is arranged on the sealing substrate 50. The sensing electrode 51 and the driving electrode 46B for sensor in each sensor section 20S are laminated so that a capacitance (capacitor C1) is formed.

In the present embodiment, the sensing electrode 51 is provided on the region of the sealing substrate 50, which corresponds to each sensor section 20S, and is covered with a front plate 52. The sensing electrode 51 is formed of, for example, ITO. The front plate 52 is formed of such as a glass and plastic transparent substrate, or a polarizing plate for reducing reflecting outside light, for example.

On the other hand, the driving electrodes 46B for sensor are provided in the same layer (on the organic layer 45) as that of the common electrodes 46A for display in the pixel sections 20R, 20G, and 20B, and are formed of, for example, the same conductive film material as that of the common electrodes 46A for display. In other words, on the organic layer 45, the above-described conductive film material that has been patterned functions as the common electrode 46A for display in each of the pixel sections 20R, 20G, and 20B and as the driving electrode 46B for sensor in each of the sensor sections 10S in this embodiment.

(Example Layout of Electrodes)

Figure 18:
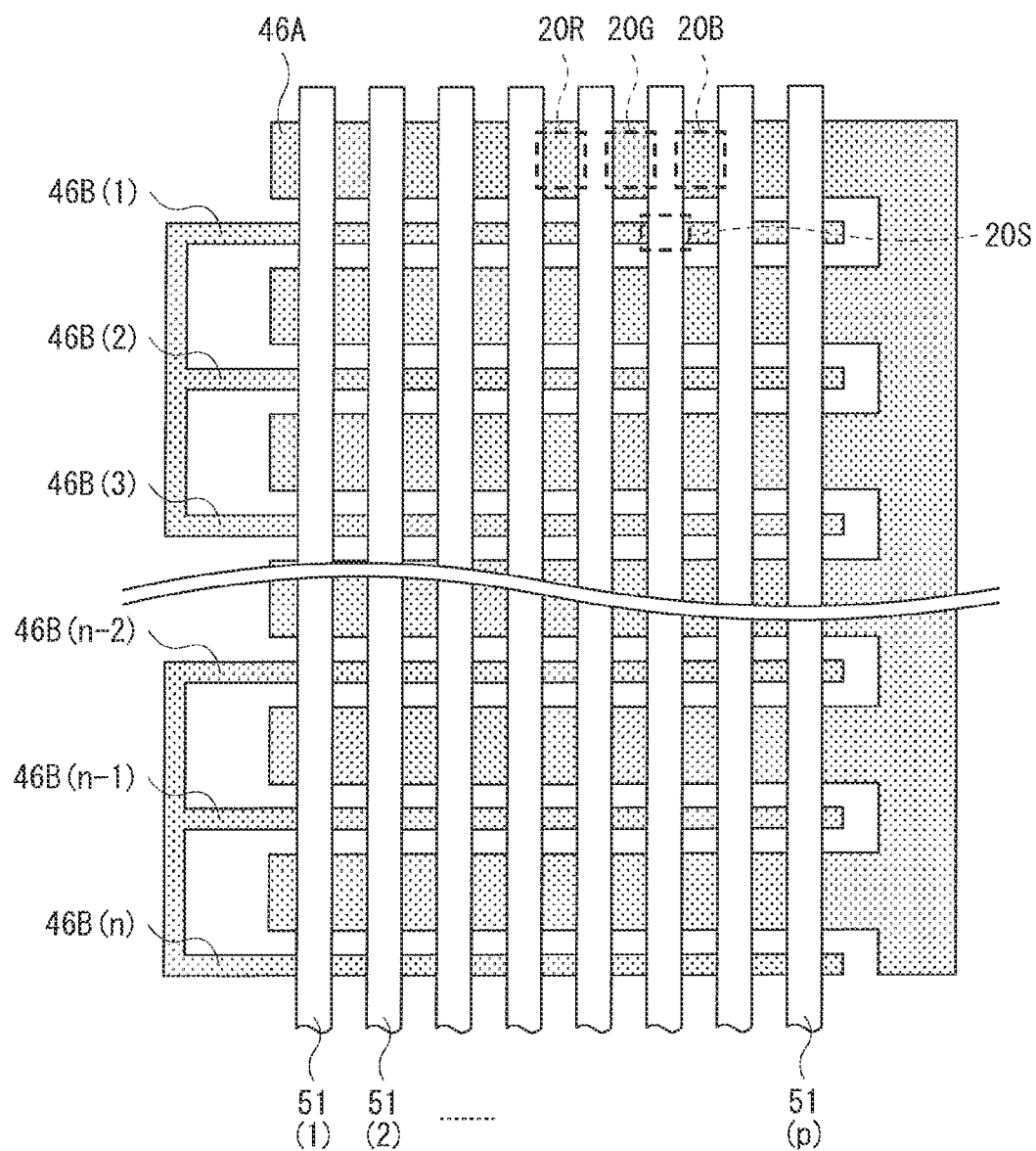
FIG. 18 is a plan schematic view illustrating an example layout of the common electrodes for display, the driving electrodes for sensor, and the sensing electrodes shown in FIG. 17.

FIG. 18 schematically illustrates an example layout (an example of arrangement configuration along the substrate plane) of the sensing electrodes 51, the common electrodes 46A for display, and the driving electrodes 46B for sensor as viewed from the sensing electrodes 51. As shown in the drawing, the common electrodes 46A for display are arranged in the shape of teeth of a comb so as to lie on or to be overlapped with the lines or rows in which the pixel sections 20R, 20G, and 20B are arranged. The driving electrodes 46B for sensor are patterned in a stripe pattern so as to extend in one direction in the spaces between the common electrodes 46A for display arranged in the shape of teeth of a comb. The common electrodes 46A for display and the driving electrodes 46B for sensor may be formed in the same process by forming the conductive film material on the entire surface of the organic layer 45 and then forming the layout pattern at one time by a photolithography technique, for example.

More than one (n-number of) driving electrode 46B for sensor (46B(1) to 46B(n)) is provided side-by-side to be connected to the driving circuit 19D for sensor, as in the driving electrodes 19B for sensor in the first embodiment. Further, as described above, m-number of driving electrodes 46B for sensor of the driving electrodes 46B(1) to 46B(n) for sensor may be electrically connected, or the n-number of driving electrodes 46B for sensor may be all electrically separated from one another. Herein, as an example, an electrode in the shape of teeth of a comb formed by connecting three driving electrodes 46B for sensor together makes a unit driving line, and a plurality of unit driving lines are arranged in parallel.

On the other hand, the sensing electrodes 51 are patterned in a stripe pattern so as to extend, in the regions among the pixel sections 20R, 20G, and 20B on the sealing substrate 50 (not shown in FIG. 18), in a direction in which the sensing electrodes 51 intersect with (in this embodiment, orthogonal to) the plurality of driving electrodes 46B for sensor. Further, more than one (p-number of) sensing electrode 51 (51(1) to 51(p)) is provided side-by-side. "q" number of sensing electrodes 51 of the sensing electrodes 51(1) to 51(p) may be electrically connected together, or the p-number of sensing electrodes 51 may be all electrically separated from one another. Moreover, the sensing electrodes 51 do not necessarily have to be arranged separately from (i.e., do not necessarily have to be overlapped with) the pixel sections 20R, 20G, and 20B, and all or part of the sensing electrodes 51 may lie on or be overlapped with the pixel sections 20R, 20G, and 20B, as described above. In other words, the sensing electrodes 51 may be freely arranged regardless of the location of the pixel sections 20R, 20G, and 20B as long as the sensing electrodes 51 are provided in a rectangular pattern or in rectangles as a whole.

By arranging the sensing electrodes 51 and the driving electrodes 46B for sensor as described above, dielectric layers (for example, protective layer 47, BM layer 48, and sealing substrate 50) formed continuously from the pixel sections 20R, 20G, and 20B are (for example, vertically) sandwiched between the sensing electrodes 51 and the driving electrodes 46 for sensor at the intersections of the sensing electrodes 51 and the driving electrodes 46B for sensor. This means that a capacitance (the capacitor C1) is formed at the intersections of the sensing electrodes 51 and the driving electrodes 46B for sensor (the intersections function as the sensor sections 20S).

Furthermore, since the sensor sections 20S are two-dimensionally formed in a matrix pattern as in the first embodiment in such a manner that more than one sensing electrode 51 and more than one driving electrode 46B for sensor are provided so that the sensing electrodes 51 intersect with the driving electrodes 46B for sensor, it is possible to detect the position of an object as two-dimensional coordinates. In addition, it is also possible to detect the presence or absence of multi-touch.

In the present embodiment, a driving signal (Vs) of an alternating and rectangular waveform is applied to the driving electrodes 46B for sensor from the driving electrode driver 19D described above, for example. A detection signal (Vdet) based on the capacitance is obtained from the sensing electrodes 51, and the obtained detection signal is sent to the detecting circuit 8 described above.

[Operations and Advantages of Organic EL Display Device 2]

(Image Display Operation)

In the organic EL display device 2, the driving circuit 31 for a scanning line and a power source line as well as the driving circuit 32 for a signal line perform display driving to the pixel sections 20R, 20G, and 20B, as in the first embodiment. In this way, a driving current is injected into the organic layer 45 (white light emitting layer in this embodiment) in the pixel sections 20R, 20G, and 20B, occurring white light emission. Respective white light beams emitted from the pixel sections 20R, 20G, and 20B pass through the common electrode 46A for display and then pass through their corresponding color filters, that is, a red filter layer 49R, a green filter layer 49G, and a blue filter layer 49B, respectively. Thereafter, the white light beams pass through the sealing substrate 50 and the front plate 52 in this order, so that the white lights are emitted from above the front plate 52 as a red light, a green light, and a blue light. In this way, color image display of the top emission scheme is performed in the pixel sections 20R, 20G, and 20B.
(Object Detection Operation)

On the other hand, in the organic EL display device 2, the driving circuit 19D for sensor supplies a driving signal Vs to the driving electrodes 46B (46B(1) to 46B(n)) for sensor in a line-sequential manner. At this time, the sensor section 20S, which forms a capacitance (the capacitor C1) with the sensing electrode 51 and the driving electrode 46B for sensor, detects a contacting object or an approaching object as follows.

When the driving signal Vs is applied to the driving electrodes 46B(1) to 46B(n) for sensor in a line-sequential manner as described above, charging and discharging are performed to each of a plurality of (in this case, p-number of) capacitors Cn1 to CnP formed at the intersections of the sensing electrodes 51(1) to 51(p) and one of the driving electrodes 46B for sensor to which the driving signal Vs is being applied at the very moment. As a result, the detection signal Vdet with a magnitude corresponding to the capacitance value of the capacitor C1 is output from each of the sensing electrodes 51(1) to 51(p). Further, the capacitors C1 to be charged and discharged sequentially move from one line to another with scanning using the driving signal Vs.

When the scanning using the driving signal Vs is being performed, the magnitude of the detection signal Vdet is nearly uniform if a finger, for example, of a user is not present on the surface of the front plate 52. On the other hand, when a finger of a user is in contact with or in proximity to the surface of the front plate 52, the capacitor C2 formed by the finger is added to the capacitor C1 initially formed in the part where the finger is in contact with or in proximity thereto. As a result, the value of the detection signal Vdet at the time when the contacting part (or the proximity part) is scanned becomes smaller than that of the other part. The detection signal Vdet obtained is output to the detection circuit 8, and the detection circuit 8 detects the presence or absence of a contacting object.

As described above, in the present embodiment, the organic EL display device 2 of the top emission type includes: the plurality of pixel electrodes 44; the organic layer 45 having a light emission layer; the common electrode 46A for display; the sealing substrate 50; and the front plate 52 in this order on the substrate 41. Further, the organic EL display device 2 includes, between the transparent substrate 11 and the front plate 52, the sensing electrode 51 and the driving electrode 46B for sensor in this order from the front plate 52 side. The driving electrode 46B for sensor forms a capacitance (a capacitor C1) with the sensing electrode 51. That is, in the present embodiment, the pixel sections 20R, 20G, and 20B which perform image display, and the sensor sections 20S which perform object detection are provided in a mixed fashion. Thus, when display driving is performed to the pixel sections 20R, 20G, and 20B, light emitted from the organic layer 45 is drawn from the front plate 52 side (an image is display on the front plate 52 side). On the other hand, when the sensor section 20S is driven, the presence or absence of an object in contact with or in proximity to the front plate 52 serving as a display screen is detected (object detection is performed on the front plate 52 side). In this way, object detection is enabled without externally mounting a touch panel module on the sealing substrate 50. Hence, an organic EL display device provided with a touch sensor function is achieved without increasing the thickness of the entire device.

Also, providing the driving electrode 46B for sensor is provided in the same layer as the layer of the common electrode 46A for display in the pixel sections 20R, 20G, and 20B makes it possible to easily form the common electrode 46A for display and the driving electrode 46B for sensor by patterning in the same process. Further, forming the common electrode 46A for display and the driving electrode 46B for sensor in the same layer makes the device thinner than forming these electrodes in different layers.

Figure 19:
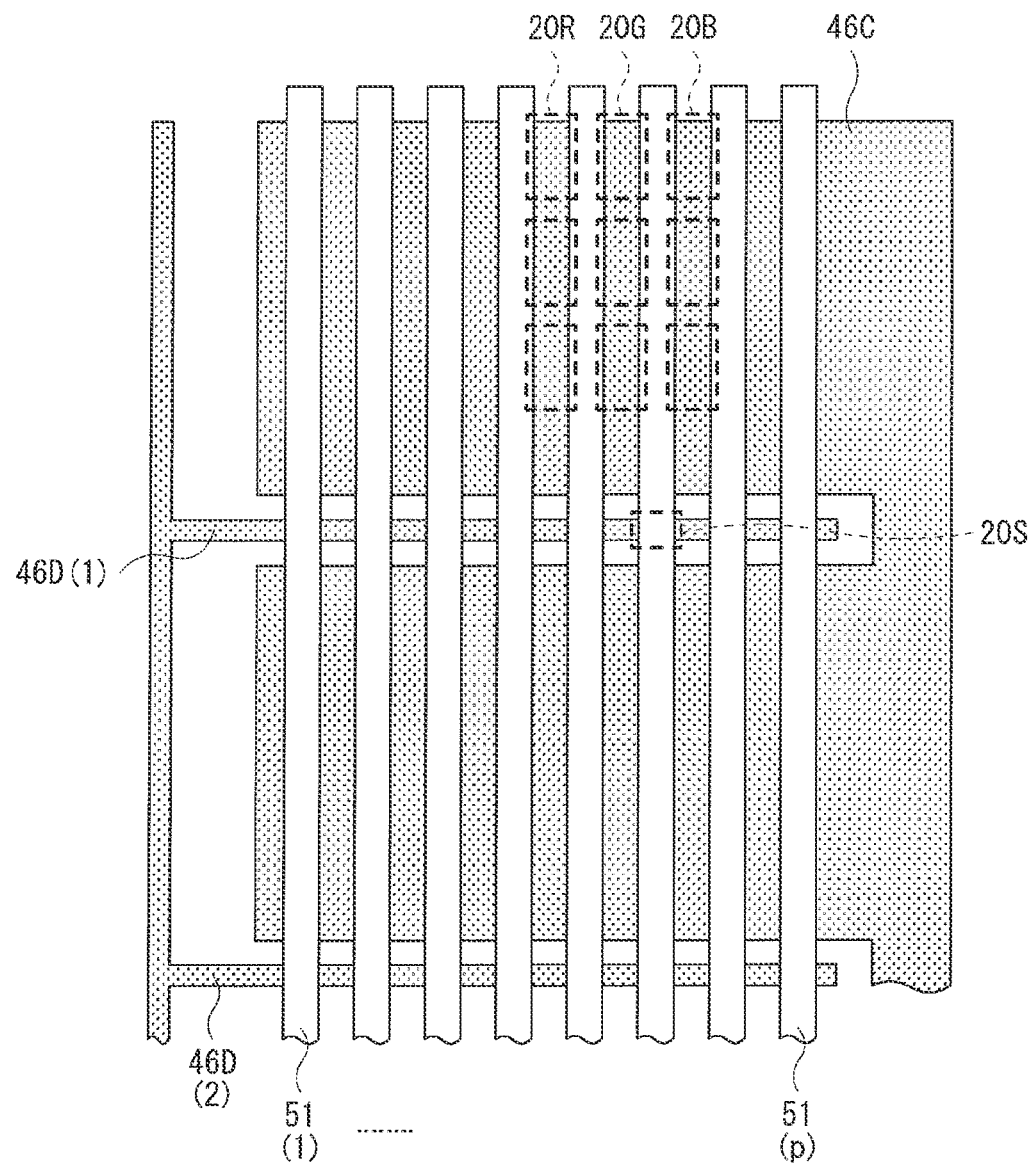
FIG. 19 is a plan schematic view illustrating another example of the layout shown in FIG. 18.

Although the second embodiment is a case where the driving electrode 46B for sensor is provided in spaces among the pixel sections 20R, 20G, and 20B (that is, the driving electrode 46B for sensor and one pixel line are alternately arranged), the layout configuration of the driving electrodes for sensor is not limited to this. For example, more than one driving electrode for sensor denoted by 46D(1), 46D(2), and so on may be provided so that one driving electrode for sensor is arranged among every several pixel lines, as shown in FIG. 19. In other words, the common electrode 46C for display may be provided to cover the region corresponding to a plurality of pixel lines, and the driving electrodes 46D for sensor (46D(1), 46D(2), and so on) may be provided in spaces among the common electrodes 46C for display. FIG. 19 shows a case where the driving electrode 46D for sensor (46D(1), 46D(2), and so on) is provided among every 3 pixel lines.

Further, although in the second embodiment, the cathode electrode layer is separated into the common electrode 46A for display and the driving electrode 46B for sensor, and the sensing electrode 51 is provided on the sealing substrate 50, the sensing electrode may be provided to the cathode electrode layer. That is, the cathode electrode layer may be separated into the common electrode 46A for display and the sensing electrode, and the detection signal Vdet may be extracted from the sensing electrode. It is to be noted that the driving electrode for sensor is provided in the same layer as that of the pixel electrode (anode electrode layer) in the above configuration, as described in the first embodiment (bottom emission type). Alternatively, the scanning line WSL, power source line DSL, or signal line DTL may be used as the driving electrode for sensor. Further, the driving electrode for sensor may be arranged in the same layer as that of the light-blocking metal.

Further, a modification (fifth modification) of the organic EL display device according to the second embodiment will be hereinafter described. The components of substantially the same functions as those in the second embodiment are designated by the same reference characters as those in the second embodiment for adequate omission of descriptions.

<Fifth Modification>

Figure 20:
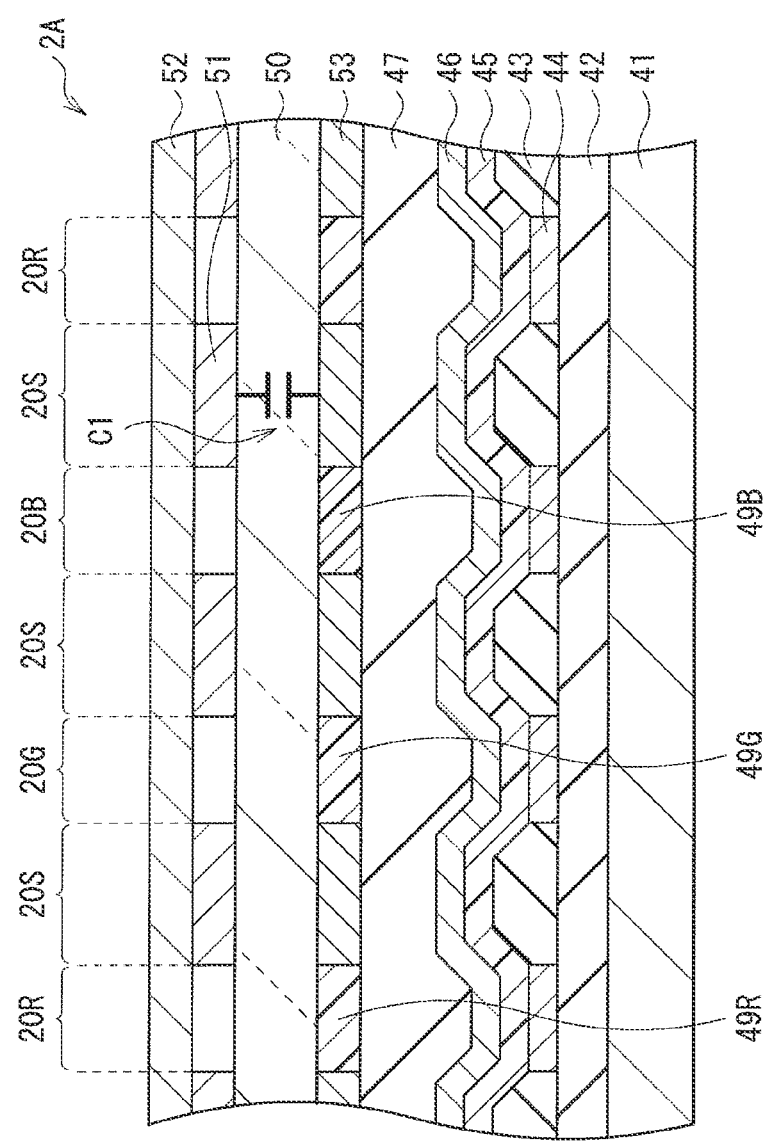
FIG. 20 is a cross-sectional view illustrating a schematic configuration of an organic EL display device according to a fifth modification.

FIG. 20 illustrates a cross-sectional configuration of an organic EL display device (organic EL display device 2A) according to a fifth modification. The organic EL display device 2A includes a plurality of organic EL elements of the top emission type as display pixels, and has a touch sensor function of a capacitance type, as the organic EL display device 2 according to the second embodiment does. Specifically, the organic EL display device 2A has, on the substrate 41, the sensor section 20S in the selective regions among the pixel sections 20R, 20G, and 20B. Further, the sensing electrodes 51 are provided on the regions of the sealing substrate 50 which correspond to the sensor sections 20S. The pixel sections 20R, 20G, and 20B have the organic layer 45, upper electrode 46, protective layer 47, color filter layers (red filter layer 49R, green filter layer 49G, and blue filter layer 49B), and sealing substrate 50 on the pixel electrode 44, as in the second embodiment.

It is to be noted that in the present modification, the BM layer 53 serves as the driving electrode for sensor and that a capacitance (the capacitor C1) is formed with the BM layer 53 and the sensing electrode 51 in the sensor section 20S. Hence, unlike the second embodiment, the BM layer 53 is formed of conductive material, more specifically, a signal layer film of any one of, for example, chromium (Cr), nickel (Ni), titanium (Ti) and carbon, or a lamination film of at least two thereof. Further, a black chromium oxide such as chromium oxide (II) and chromium oxide (IV) may be used as part of the lamination film. The upper electrode 46 is a so-called "flat-type" or "solid" electrode.

Figure 21:
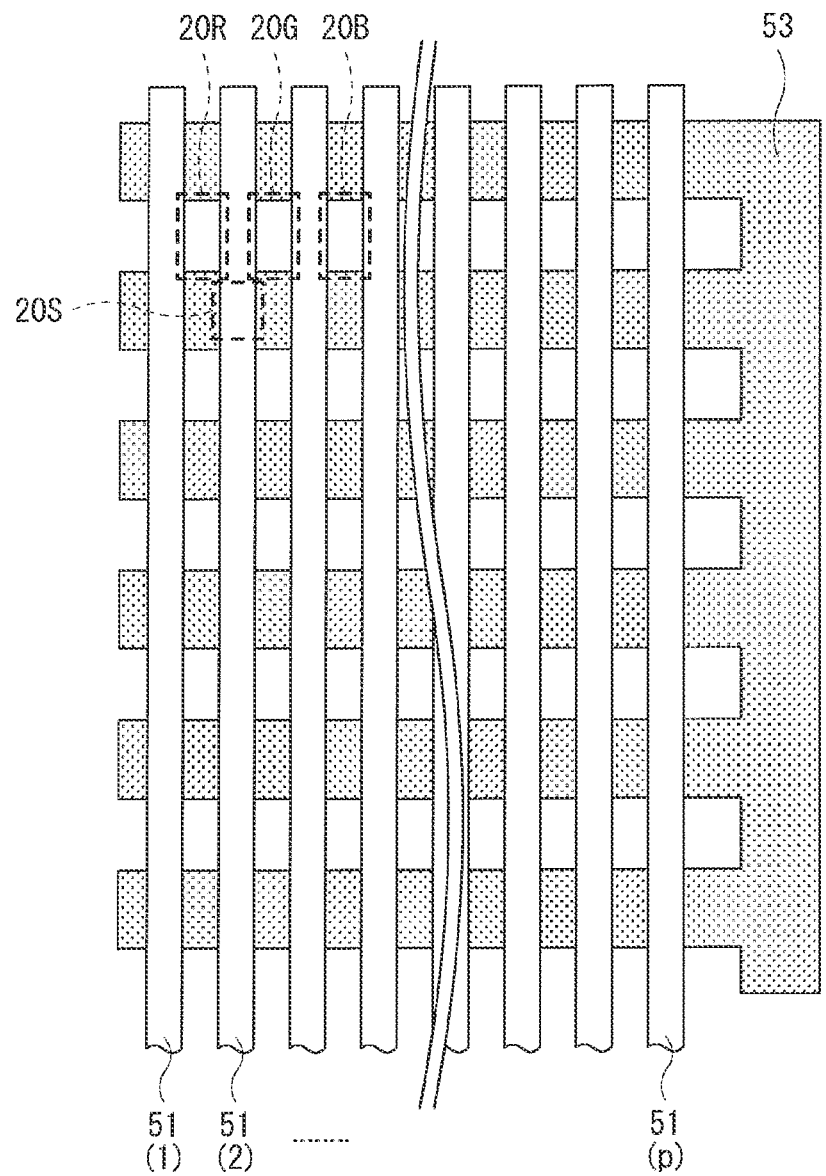
FIG. 21 is a plan schematic view illustrating an example layout of the BM layers and the sensing electrodes shown in FIG. 20.

FIG. 21 schematically illustrates an example layout (example of arrangement configuration along the substrate plane) of the sensing electrodes 51 and the BM layers 53 (driving electrodes for sensor) as viewed from the sensing electrodes 51. As shown in the drawing, the BM layers 53 are formed in a stripe pattern or in the shape of teeth of a comb so as to separate from or not to be overlapped with the lines or rows in which the pixel sections 20R, 20G, and 20B are arranged. The BM layers 53 are connected to the driving electrode driver 19D described above, and a driving signal (Vs) of an alternating and rectangular waveform, is applied to the BM layers 53 from the driving electrode driver 19D, for example. On the other hand, the sensing electrodes 51(1) to 51(p) are patterned in a stripe pattern so as to extend in a direction in which the sensing electrodes 51 intersect with (in this embodiment, orthogonal to) the BM layers 53.

By arranging the sensing electrodes 51 and the BM layers 53 as described above, a dielectric layer (for example, the sealing substrate 50) formed continuously from the pixel sections 20R, 20G, and 20B is (for example, vertically) sandwiched between the sensing electrodes 51 and the BM layers 53 at the intersections of the sensing electrodes 51 and the BM layers 53. In other words, a capacitance (the capacitor C1) is formed at the intersections of the sensing electrodes 51 and the BM layers 53 (the intersections function as the sensor sections 20S).

As in the present modification, the BM layer 53 may be formed of conductive material and serve as the driving electrode for sensor. Since it is possible to use an existing layer as the driving electrode for sensor in this case, the present modification achieves the same advantages as in the second embodiment. Further, the present modification is particularly advantageous when it is difficult to pattern the cathode electrode for display due to influence of, for example, the pixel pitch.

<Sixth Modification>

Figure 22:
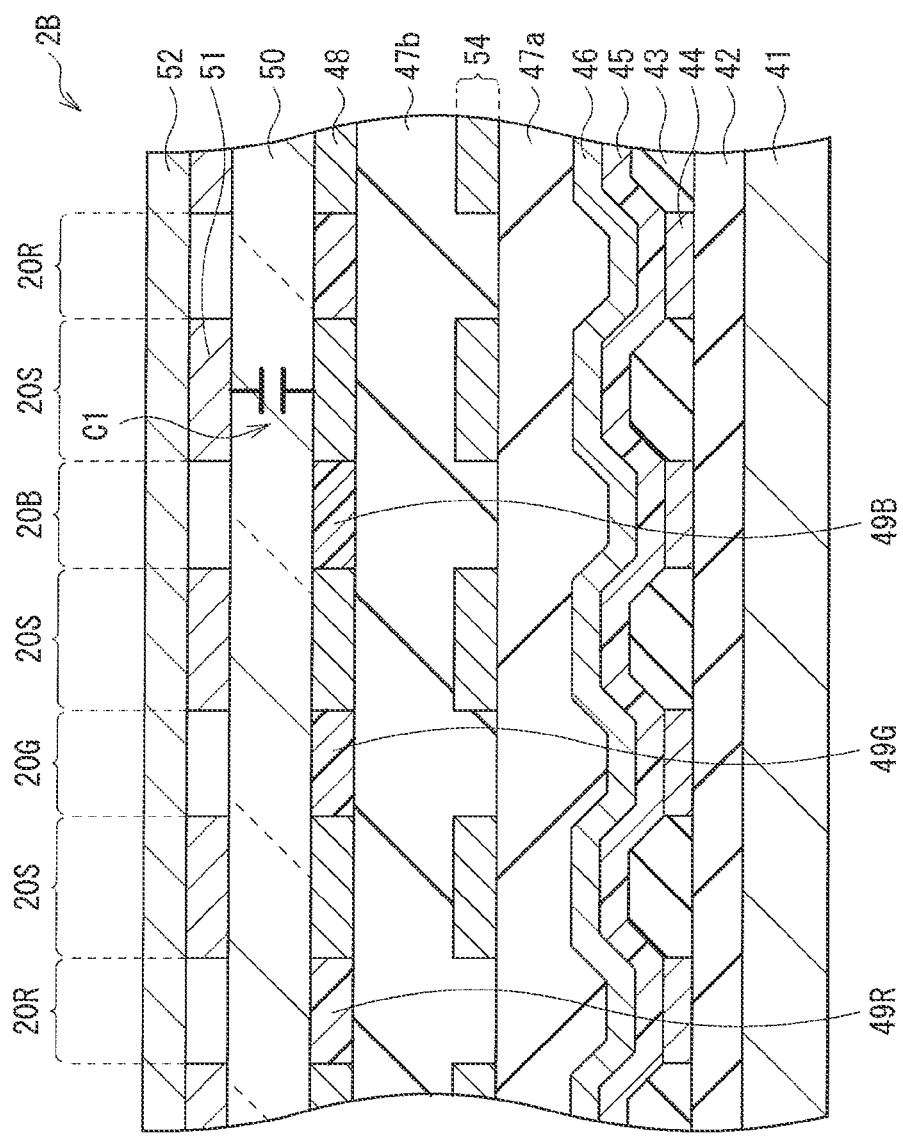
FIG. 22 is a cross-sectional view illustrating a schematic configuration of an organic EL display device according to a sixth modification.

FIG. 22 illustrates a cross-sectional configuration of an organic EL display device (organic EL display device 2B) according to a sixth modification. The organic EL display device 2B includes a plurality of organic EL elements of the top emission type as display pixels, and has a touch sensor function of a capacitance type, as the organic EL display device 2 according to the second embodiment does. Specifically, the organic EL display device 2B has the pixel sections 20R, 20G, 20B, and sensor sections 20S on the substrate 41. The pixel sections 20R, 20G, and 20B have the organic layer 45, upper electrode 46, protective layers 47 (47a and 47b), color filter layers (red filter layer 49R, green filter layer 49G, and blue filter layer 49B), and sealing substrate 50 on the pixel electrode 44, as in the second embodiment and the fifth modification.

It is to be noted that in the present modification, a driving electrode 54 for sensor is interposed between the protective layers 47a and 47b provided on the upper electrode 46, and a capacitance (the capacitor C1) is formed with the driving electrode 54 for sensor and the sensing electrode 51. The driving electrode 54 for sensor is formed of a transparent conductive film of ITO, for example. The sensor section 20S is formed in the regions corresponding to the driving electrodes 54 for sensor and the sensing electrodes 51. In the present modification, the driving electrodes 54 for sensor and the sensing electrodes 51 may be freely arranged regardless of the location of the pixel sections 20R, 20G, and 20B, and part or all of the sensor sections 20S may lie on or overlapped with the pixel sections 20R, 20G, and 20B. However, FIG. 22 here shows an example in which the sensor section 20S is formed in the regions among the pixel sections 20R, 20G, and 20B.

It is possible to obtain nearly the same advantages as in the second embodiment by separately providing the driving electrode 54 for sensor in a certain region between the upper electrode 46 and the sealing substrate 50, that is, between, for example, the protective layers 47a and 47b as in the present modification. Further, the present modification is particularly advantageous when it is difficult to pattern the cathode electrode for display, as in the fifth modification.

APPLICATION EXAMPLE

Next, application examples (application examples 1 to 5) of the organic EL display device with the touch sensor described in the embodiments and modifications will be described with reference to FIGS. 23 to 27G. The organic EL display devices according to the embodiments and modifications are applicable to electronic units in every field, including television devices, digital cameras, mobile terminal devices such as notebook computers and mobile phones, and video cameras. In other words, the display devices according to the embodiments and modifications are applicable to electronic units in every field which display picture signals input from the outside or picture signals generated in the inside as images or pictures.

First Application Example

Figure 23:
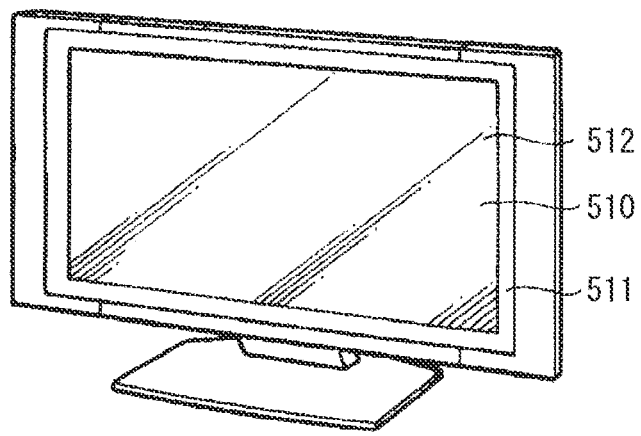
FIG. 23 is a perspective view illustrating an external appearance of a first application example of the display devices according to the embodiments and the modifications.

FIG. 23 illustrates the external appearance of a television device according to a first application example. The television device has, for example, a picture display screen section 510 including a front panel 511 and a filter glass 512, and the picture display screen section 510 corresponds to the organic EL display device according to any one of the embodiments and the modifications, for example.

Second Application Example

Figure 24A:
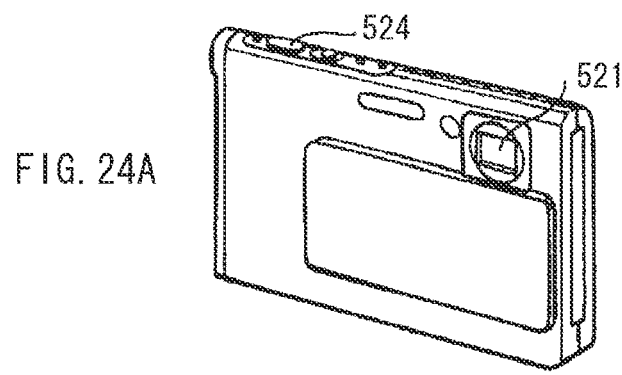
FIGS. 24A and 24B are perspective views illustrating external appearances of a second application example viewed from the front and from the back, respectively.
Figure 24B:
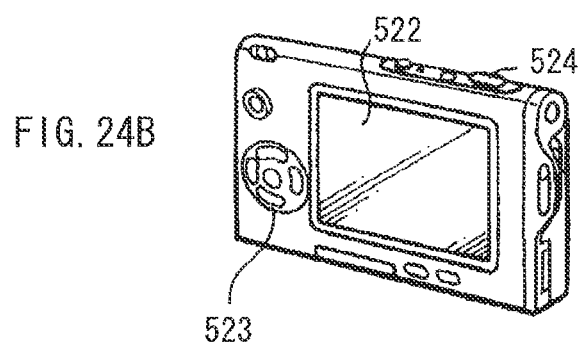

FIGS. 24A and 24B each illustrate the external appearance of a digital camera according to a second application example. The digital camera has, for example, a light emission section 521 for flash, display section 522, menu switch 523, and shutter bottom 524, and the display section 522 corresponds to the organic EL display device according to any one of the embodiments and the modifications, for example.

Third Application Example

Figure 25:
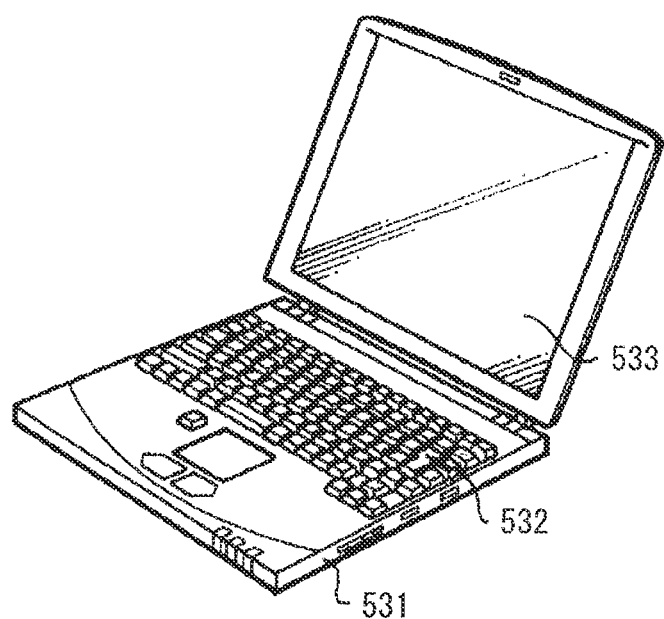
FIG. 25 is a perspective view illustrating an external appearance of a third application example.

FIG. 25 illustrates the external appearance of a notebook computer according to a third application example. The notebook computer has, for example, a body 531, a keyboard 532 for input operation of characters etc., and a display section 533 which displays an image, and the display section 533 corresponds to the organic EL display device according to any one of the embodiments and the modifications, for example.

Fourth Application Example

Figure 26:
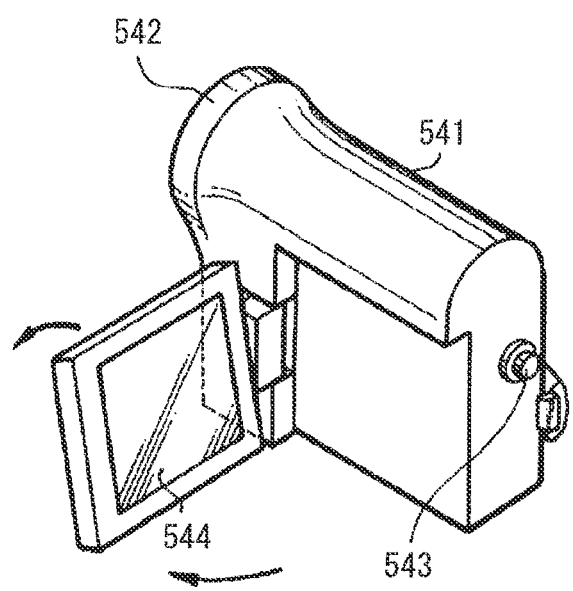
FIG. 26 is a perspective view illustrating an external appearance of a fourth application example.

FIG. 26 illustrates the external appearance of a video camera according to a fourth application example. The video camera has, for example, a body section 541, a lens 542 for taking an image of an object, which is provided on the front side of the body section 541, and a start/stop switch 543 at the image taking, and a display section 544. The display section 544 corresponds to the organic EL display device according to any one of the embodiments and the modifications, for example.

Fifth Application Example

FIGS. 27A to 27G each illustrate the external appearance of a mobile phone according to a fifth application example. The mobile phone has, for example, an upper housing 710, a lower housing 720, a connecting section (hinge section) 730 which connects the upper and lower housings 710 and 720 to each other, a display 740, a sub-display 750, a picture light 760, and a camera 770. Further, the display 740 or the sub-display 750 correspond to the organic EL display device according to any one of the embodiments and the modifications, for example.

Although the present disclosure has been described with reference to the embodiments, modifications, and application examples, it is not limited to these examples and various variations may be made thereto. Concretely, although the sensor sections are provided in a matrix pattern to correspond to the intersections of the driving electrodes for sensor and the sensing electrodes in the embodiments, the modifications, and the application examples, the location of the sensor sections is not particularly limited as long as they are located in the regions among the pixel sections.

Further, although in the second embodiment, the driving electrode 46B for sensor is provided on the organic layer 45 to be electrically separated from the common electrode 46A for display, an upper electrode may be formed as a flat-type (solid-type) electrode on the organic layer 45 and a fixed common driving signal may be applied to the upper electrode. This configuration also achieves the same advantages as those of the present disclosure by using the common driving signal as the driving signal for sensor.

Furthermore, although in the second embodiment, the three pixel sections (sub-pixels) R, G, B make one pixel, the pixel sections in the present disclosure are not limited to this. For example, a four sub-pixel configuration including a pixel section for white (W) in addition to R, G, and B pixel sections may be employed. Also, the pixel sections for those three colors or four colors may not make one pixel. For example, two, or five or more sub pixels may make one pixel.

It is possible to achieve at least the following configurations (1) to (20) from the above-described example embodiments, the modifications, and the application examples of the disclosure.

(1) A display device, including:
   a first substrate having a light extraction plane;
   a plurality of first electrodes;
   an organic electroluminescence layer;
   a second electrode;
   a second substrate, wherein the first electrodes, the organic electroluminescence layer, the second electrode, and the second substrate are provided in this order on the first substrate;
   a sensing electrode allowing an object to be detected; and
   a driving electrode forming a capacitance with the sensing electrode and allowing the object to be detected, the sensing electrode and the driving electrode being provided, in this order from a first substrate side, between the first substrate and the second substrate.

(2) The display device according to (1), further including, in a display region:
   a plurality of pixel sections provided corresponding to the first electrodes; and
   one or more sensor sections including the driving electrode and the sensing electrode.

(3) The display device according to (2), further including a transistor section provided on the first substrate with an insulating film interposed therebetween,
   wherein the sensing electrode is provided between the first substrate and the insulating film.

(4) The display device according to (3), further including a leakage prevention metal layer provided in a same layer as a layer of the sensing electrode in a region corresponding to the pixel sections.

(5) The display device according to (2), wherein
   the driving electrode includes a plurality of driving electrodes,
   the sensing electrode includes a plurality of sensing electrodes, and
   the driving electrodes and the sensing electrodes extend to intersect with each other.

(6) The display device according to any one of (1) to (5), wherein the driving electrode is provided in a same layer as a layer of the first electrodes.

(7) The display device according to (6), wherein
   the first electrodes are two-dimensionally arranged in matrix, and
   the driving electrode extends in one direction in a region between the first electrodes.

(8) The display device according to any one of (1) to (5), further including:
   a scanning line;
   a signal line; and
   a power source line,
   the scanning line, the signal line, and the power source line performing display driving of the pixel sections, and the scanning line serving as the driving electrode.

(9) The display device according to any one of (1) to (5), further including:
   a scanning line;
   a signal line; and
   a power source line,
   the scanning line, the signal line, and the power source line performing display driving of the pixel sections, and the power source line serving as the driving electrode.

(10) The display device according to any one of (1) to (5), further including:
   a scanning line;
   a signal line; and
   a power source line,
   the scanning line, the signal line, and the power source line performing display driving of the pixel sections, and the signal line serving as the driving electrode.

(11) The display device according to (1), further including a detection circuit detecting, based on a detection signal, a presence or absence of the object on the first substrate side, the detection signal being obtained from the sensing electrode by application of a driving signal to the driving electrode.

(12) A display device, including:
   a first substrate;
   a plurality of first electrodes;
   an organic electroluminescence layer;
   a second electrode;

a second substrate having a light extraction plane, wherein the first electrodes, the organic electroluminescence layer, the second electrode, and the second substrate are provided in this order on the first substrate;

a driving electrode provided between the first substrate and the second substrate, the driving electrode allowing an object to be detected; and a sensing electrode provided on a second substrate side of the driving electrode, the sensing electrode forming a capacitance with the driving electrode and allowing the object to be detected.

(13) The display device according to (12), further including, in a display region:

a plurality of pixel sections provided corresponding to the first electrodes; and one or more sensor sections including the driving electrode and the sensing electrode.

(14) The display device according to (13), wherein the sensing electrode is provided on the second substrate.

(15) The display device according to (14), wherein the second electrode serves as the driving electrode, or is provided in a same layer as a layer of the driving electrode.

(16) The display device according to (14), further including a conductive black matrix layer on the second electrode, the conductive black matrix layer serving as the driving electrode.

(17) The display device according to (14), wherein the driving electrode is provided between the second electrode and the second substrate.

(18) The display device according to (13), further including:

a scanning line;

a signal line; and a power source line, the scanning line, the signal line, and the power source line performing display driving of the pixel sections, wherein the sensing electrode is provided in a same layer as a layer of the second electrode, and the driving electrode is provided in a same layer as a layer of the first electrodes, or any one of the scanning line, the signal line, and the power source line serves as the driving electrode.

(19) An electronic unit with a display device, the display device including:

a first substrate having a light extraction plane;

a plurality of first electrodes;

an organic electroluminescence layer;

a second electrode;

a second substrate, wherein the first electrodes, the organic electroluminescence layer, the second electrode, and the second substrate are provided in this order on the first substrate;

a sensing electrode allowing an object to be detected; and a driving electrode forming a capacitance with the sensing electrode and allowing the object to be detected, the sensing electrode and the driving electrode being provided, in this order from a first substrate side, between the first substrate and the second substrate.

(20) An electronic unit with a display device, the display device including:

a first substrate;

a plurality of first electrodes;

an organic electroluminescence layer;

a second electrode;

a second substrate having a light extraction plane, wherein the first electrodes, the organic electroluminescence layer, the second electrode, and the second substrate are provided in this order on the first substrate;

a driving electrode provided between the first substrate and the second substrate, the driving electrode allowing an object to be detected; and a sensing electrode provided on a second substrate side of the driving electrode, the sensing electrode forming a capacitance with the driving electrode and allowing the object to be detected.

The present disclosure contains subject matter related to that disclosed in Japanese Priority Patent Application JP 2011-078491 filed in the Japan Patent Office on Mar. 31, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device, comprising:
a first substrate having a light extraction plane;
a plurality of first electrodes;
an organic electroluminescence layer;
a second electrode;
a second substrate, wherein the first electrodes, the organic electroluminescence layer, the second electrode, and the second substrate are provided in this order on the first substrate;
a sensing electrode allowing an object to be detected; and
a driving electrode forming a capacitance with the sensing electrode and allowing the object to be detected, the sensing electrode and the driving electrode being provided, in this order from a first substrate side, between the first substrate and the second substrate.

2. The display device according to claim 1, further comprising, in a display region:
a plurality of pixel sections provided corresponding to the first electrodes; and
one or more sensor sections including the driving electrode and the sensing electrode.

3. The display device according to claim 2, further comprising a transistor section provided on the first substrate with an insulating film interposed therebetween,
wherein the sensing electrode is provided between the first substrate and the insulating film.

4. The display device according to claim 3, further comprising a leakage prevention metal layer provided in a same layer as a layer of the sensing electrode in a region corresponding to the pixel sections.

5. The display device according to claim 2, wherein
the driving electrode includes a plurality of driving electrodes,
the sensing electrode includes a plurality of sensing electrodes, and
the driving electrodes and the sensing electrodes extend to intersect with each other.

6. The display device according to claim 1, wherein the driving electrode is provided in a same layer as a layer of the first electrodes.

7. The display device according to claim 6, wherein
the first electrodes are two-dimensionally arranged in matrix, and
the driving electrode extends in one direction in a region between the first electrodes.

8. The display device according to claim 1, further comprising:
a scanning line;
a signal line; and
a power source line,
the scanning line, the signal line, and the power source line performing display driving of the pixel sections, and the scanning line serving as the driving electrode.

9. The display device according to claim 1, further comprising:
a scanning line;
a signal line; and
a power source line,
the scanning line, the signal line, and the power source line performing display driving of the pixel sections, and the power source line serving as the driving electrode.

10. The display device according to claim 1, further comprising:
a scanning line;
a signal line; and
a power source line,
the scanning line, the signal line, and the power source line performing display driving of the pixel sections, and the signal line serving as the driving electrode.

11. The display device according to claim 1, further comprising a detection circuit detecting, based on a detection signal, a presence or absence of the object on the first substrate side, the detection signal being obtained from the sensing electrode by application of a driving signal to the driving electrode.

12. An electronic unit with a display device, the display device comprising:
a first substrate having a light extraction plane;
a plurality of first electrodes;
an organic electroluminescence layer;
a second electrode;
a second substrate, wherein the first electrodes, the organic electroluminescence layer, the second electrode, and the second substrate are provided in this order on the first substrate;
a sensing electrode allowing an object to be detected; and
a driving electrode forming a capacitance with the sensing electrode and allowing the object to be detected, the sensing electrode and the driving electrode being provided, in this order from a first substrate side, between the first substrate and the second substrate.

13. The electronic unit according to claim 12, further comprising, in a display region:
a plurality of pixel sections provided corresponding to the first electrodes; and
one or more sensor sections including the driving electrode and the sensing electrode.

14. The electronic unit according to claim 13, further comprising a transistor section provided on the first substrate with an insulating film interposed therebetween,
wherein the sensing electrode is provided between the first substrate and the insulating film.

15. The electronic unit according to claim 14, further comprising a leakage prevention metal layer provided in a same layer as a layer of the sensing electrode in a region corresponding to the pixel sections.

16. The electronic unit according to claim 13, wherein
the driving electrode includes a plurality of driving electrodes,
the sensing electrode includes a plurality of sensing electrodes, and
the driving electrodes and the sensing electrodes extend to intersect with each other.

17. The electronic unit according to claim 12, wherein the driving electrode is provided in a same layer as a layer of the first electrodes.

18. The electronic unit according to claim 17, wherein
the first electrodes are two-dimensionally arranged in matrix, and
the driving electrode extends in one direction in a region between the first electrodes.

19. The electronic unit according to claim 12, further comprising:
a scanning line;
a signal line; and
a power source line,
the scanning line, the signal line, and the power source line performing display driving of the pixel sections, and one of the scanning line, the signal line, and the power source line serving as the driving electrode.

20. The electronic unit according to claim 12, further comprising a detection circuit detecting, based on a detection signal, a presence or absence of the object on the first substrate side, the detection signal being obtained from the sensing electrode by application of a driving signal to the driving electrode.

* * * * *